(12) United States Patent
Kim

(10) Patent No.: US 8,278,669 B2
(45) Date of Patent: Oct. 2, 2012

(54) LIGHT EMITTING DEVICE AND FABRICATING METHOD THEREOF

(75) Inventor: Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 61 days.

(21) Appl. No.: 12/590,281

(22) Filed: Nov. 5, 2009

(65) Prior Publication Data

US 2010/0109022 A1     May 6, 2010

(30) Foreign Application Priority Data

Nov. 6, 2008 (KR) ................. 10-2008-0109943

(51) Int. Cl.
    *H01L 33/00*     (2010.01)
(52) U.S. Cl. ............. 257/84; 257/79; 257/80; 257/81; 257/82; 257/E33.065; 257/98; 257/99
(58) Field of Classification Search ............ 257/82, 257/83, 84, 88, 94, 95, 98, 99, 103, E33.062, 257/E33.067, E33.07, 80, 79, 81, E33.065
See application file for complete search history.

(56) References Cited

U.S. PATENT DOCUMENTS

| | | | |
|---|---|---|---|
| 6,803,604 B2 * | 10/2004 | Takahashi et al. | 257/80 |
| 2006/0181828 A1 * | 8/2006 | Sato et al. | 361/91.1 |
| 2006/0192084 A1 | 8/2006 | Lee et al. | |
| 2007/0120133 A1 * | 5/2007 | Koda et al. | 257/80 |
| 2007/0164306 A1 | 7/2007 | Nakahata et al. | |
| 2007/0176188 A1 * | 8/2007 | Tanaka et al. | 257/88 |

FOREIGN PATENT DOCUMENTS

| | | |
|---|---|---|
| JP | 2006005331 | 1/2006 |
| KR | 1020060010344 A | 2/2006 |
| KR | 100587019 B1 | 5/2006 |

* cited by examiner

*Primary Examiner* — Ha Tran T Nguyen
*Assistant Examiner* — Suberr Chi
(74) *Attorney, Agent, or Firm* — Onello & Mello, LLP

(57) ABSTRACT

In a light emitting device and a fabricating method thereof are provide, wherein the light emitting device includes a light converting element, and a light emitting element positioned on the light converting element and including a first electrode, a light emitting structure and a second electrode, the first electrode formed on the light emitting element and having a first opening, the light emitting structure having a first conductive pattern of a first conductivity type, a light emitting pattern, and a second conductive pattern of a second conductivity type, which are sequentially stacked, and the second electrode formed on the second conductive pattern, wherein the light generated from the light emitting structure reaches the light converting element through the first opening.

11 Claims, 22 Drawing Sheets

LIGHT EMITTING DEVICE AND FABRICATING METHOD THEREOF

This application claims priority from Korean Patent Application No. 10-2008-0109943 filed on Nov. 6, 2008 in the Korean Intellectual Property Office, the disclosure of which is incorporated herein by reference in its entirety.

BACKGROUND

1. Field of the Invention

Embodiments of the present invention relate to a light emitting device and a fabricating method thereof.

2. Description of the Related Art

A light emitting device, such as a light emitting diode ("LED"), emits light as a result of electron-hole combination. Light emitting devices offer the advantages of relatively low power consumption, increased lifespan, small size for installation, and is physically robust against external environmental factors, including shock.

The light output characteristics of the light emitting device may change depending on various conditions. For example, the light output characteristics of the light emitting device may be degraded as the ambient temperature increases or as the time period of use of the light emitting device is extended.

SUMMARY

Embodiments of the invention provide a light emitting device having stable light output characteristics.

Embodiments of the invention further provide method of fabricating light emitting devices having stable light output characteristics.

The above objects are not limited by the aforementioned objects and other objects which are not mentioned above can be apparently understood by those of ordinary skill in the art from the following description of the preferred embodiments.

According to an aspect of the present invention, there is provided a light emitting device including a light converting element, and a light emitting element positioned on the light converting element and including a first electrode, a light emitting structure and a second electrode, the first electrode formed on the light emitting element and having a first opening, the light emitting structure having a first conductive pattern of a first conductivity type, a light emitting pattern, and a second conductive pattern of a second conductivity type, which are sequentially stacked, and the second electrode formed on the second conductive pattern, wherein the light generated from the light emitting structure reaches the light converting element through the first opening.

In one embodiment, the light converting element includes a substrate of the first conductivity type and an impurity region of a second conductivity type formed in the substrate, the second conductivity type being different than the first conductivity type.

In another embodiment, the light emitting device is positioned on a circuit board, the circuit board includes first through fourth interconnections to which different biases are applied, respectively, the first and second interconnections are electrically connected to the first and second electrodes, respectively, and the third and fourth interconnections are electrically connected to the substrate of the first conductivity type and the impurity region of the second conductivity type, respectively.

In another embodiment, the biases applied to the first and second interconnections are adjusted based on a change in the light detected by the light converting element.

In another embodiment, the light converting element includes an insulating layer formed thereon, the insulating layer including a medium interconnection formed thereon, the medium interconnection including a second opening, and the first electrode is disposed on the medium interconnection, wherein the light generated from the light emitting structure reaches the light converting element through the first and second openings.

In another embodiment, the first electrode is configured in a bowl shape of a bowl and wherein the light emitting structure is configured to fill the first electrode.

According to another aspect of the present invention, there is provided a light emitting device including a light emitting element electrically connected between a first node and a second node and generating light, and a light converting element electrically connected between a third node and a fourth node and bonded to the light emitting element to sense the light generated by the light emitting element, wherein different biases are applied to the first through fourth nodes, respectively.

According to still another aspect of the present invention, there is provided a fabricating method of a light emitting device, the fabricating method including forming, on a first substrate, a light emitting structure in which a second conductive pattern of a second conductivity type, a light emitting pattern, and a first conductive pattern of a first conductivity type are sequentially stacked; forming, on the first conductive pattern, a first electrode electrically connected to the first conductive pattern, the first electrode having an opening; bonding the first substrate to a light converting element, the bonding performed so that the first electrode faces the light converting element; removing the first substrate; and forming, on the second conductive pattern of the second conductivity type, a second electrode electrically connected to the second conductive pattern after the removing of the first substrate.

In one embodiment, the light converting element includes a second substrate of the first conductivity type and an impurity region of the second conductivity type formed in the second substrate, the second conductivity type being different form the first conductivity type and the second substrate being larger than the first substrate in size, wherein the bonding of the first substrate to the light converting element comprises bonding the first substrate to the second substrate.

In another embodiment, the forming of the light emitting structure on the first substrate comprises: sequentially forming, on the first substrate, a second conductive layer of the second conductivity type, a light emitting layer, and a first conductive layer of the first conductivity type; bonding the first substrate to a third substrate larger than the first substrate in size; and patterning the stacked first conductive layer, light emitting layer and second conductive layer to form the light emitting structure including the first conductive pattern, the light emitting pattern, and the second conductive pattern.

BRIEF DESCRIPTION OF THE DRAWINGS

The above and other features and advantages of the embodiments of the present invention will become more apparent by describing in detail preferred embodiments thereof with reference to the attached drawings in which.

DETAILED DESCRIPTION OF EMBODIMENTS

Figure 1:
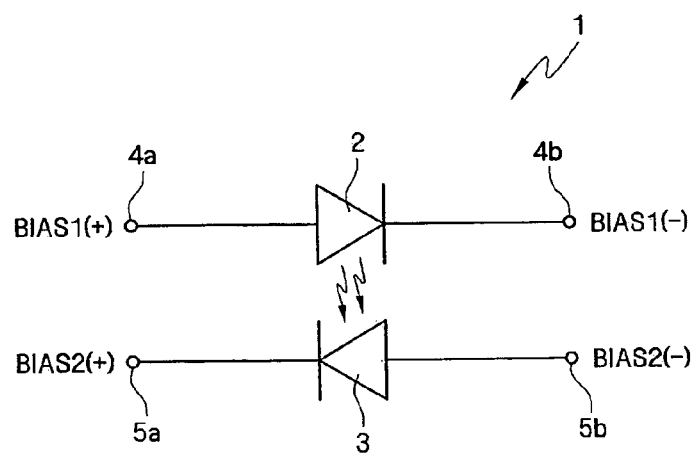
FIG. 1 is a circuit diagram illustrating a light emitting device according to a first embodiment of the present invention.

Advantages and features of the embodiments of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Like numbers refer to like elements throughout.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a light emitting device according to a first embodiment of the present invention.

Referring to FIG. 1, a light emitting device 1 according to a first embodiment of the present invention includes a light emitting element 2 generating light, and a light converting element 3 bonded to the light emitting element 2 and detecting the light emitted from the light emitting element 2.

The light converting element 3 may be, for example, a photo diode, a pinned photo diode, and so forth, and any kind of suitable photo devices can be used as the light converting element 3 as long as it is capable of converting the amount of light generated by the light emitting element 2 to an electrical signal at a certain level.

Here, the light emitting element 2 may be electrically connected between a first node 4a and a second node 4b, and the light converting element 3 may be electrically connected between a third node 5a and a fourth node 5b.

First through fourth bias signals BIAS1(+), BIAS1(−), BIAS2(+), and BIAS2(−), which are different from one another, may be applied to the first through fourth nodes 4a, 4b, 5a, and 5b, respectively. Here, the first bias BIAS1(+) has a higher level than the second bias BIAS1(−). The third bias BIAS2(+) has a higher level than the fourth bias BIAS2(−). For example, the first bias BIAS1(+) and the third bias BIAS2(+) may be positive and the second bias BIAS1(−) and the fourth bias BIAS2(−) may be negative or ground, without being limited thereto. The bias signals may be a voltage or current, or a direct current (DC) or an alternate current (AC). The reason for applying different bias signals, i.e., first through fourth biases BIAS1(+), BIAS1(−), BIAS2(+), and BIAS2(−), to the first through fourth nodes 4a, 4b, 5a, and 5b, respectively, is to operate the light emitting element 2 and the light converting element 3 independently of each other, which will be described below.

The light converting element 3 detects the light generated by the light emitting element 2. The light emitting device 1 according to the first embodiment of the present invention analyzes an amount of light detected by the light converting element 3 and determines a light output state of the light emitting element 2. As a result, if the amount of light detected by the light converting element 3 is relatively small, for example, the first and second biases BIAS1(+) and BIAS1(−) are adjusted to increase the light emitted by the light emitting element 2. If the amount of light detected by the light converting element 3 is relatively large, the first and second biases BIAS1(+) and BIAS1(−) are adjusted to reduce the light emitted from the light emitting element 2. In this way, the light emitting device 1 according to the first embodiment of the present invention may have stable light output characteristics.

Figure 2:
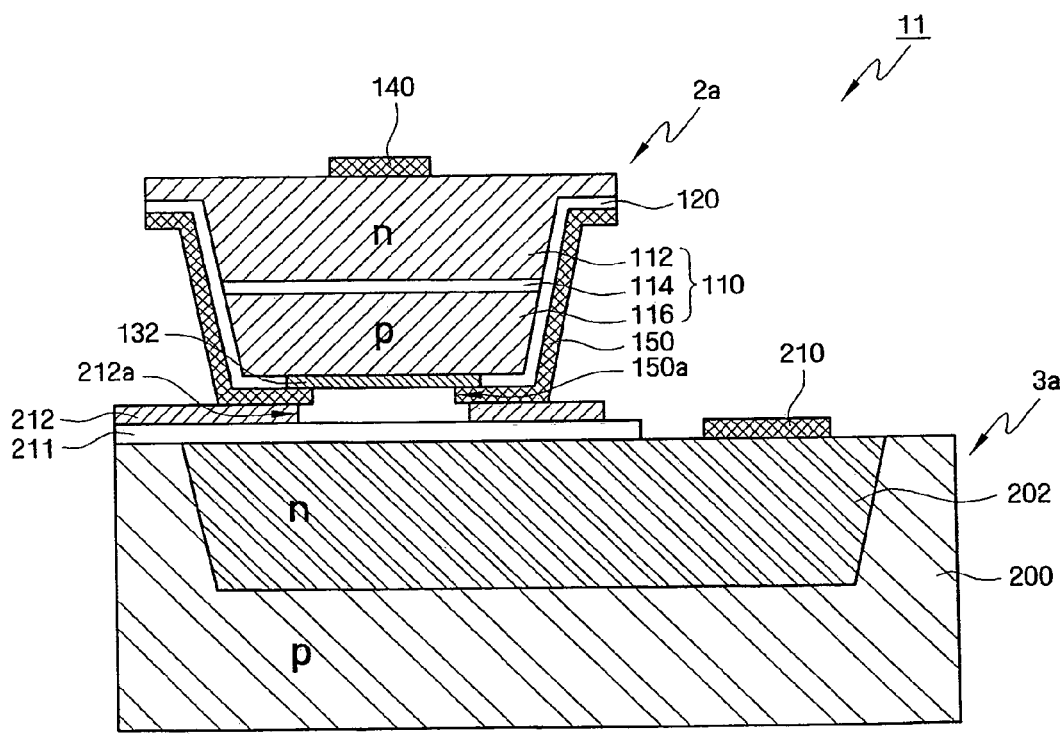
FIG. 2 is a cross-sectional view of a light emitting device according to a second embodiment of the present invention.
Figure 3A:
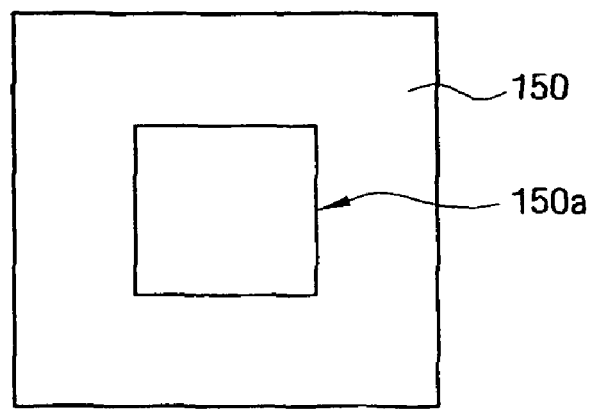
FIGS. 3A and 3B are views illustrating a number of different possible shapes of a first electrode of the light emitting device according to the second embodiment of the present invention.
Figure 3B:
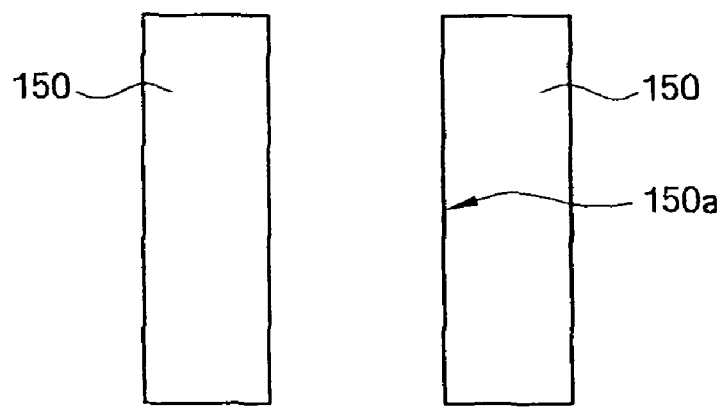
Figure 4:
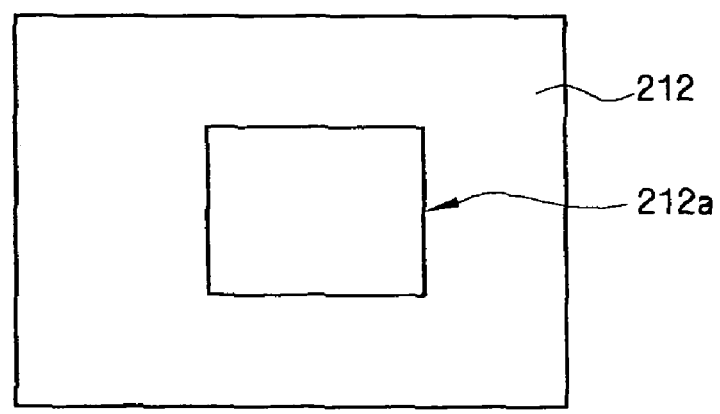
FIG. 4 is a view illustrating a medium interconnection of the light emitting device according to the second embodiment of the present invention.
Figure 5A:
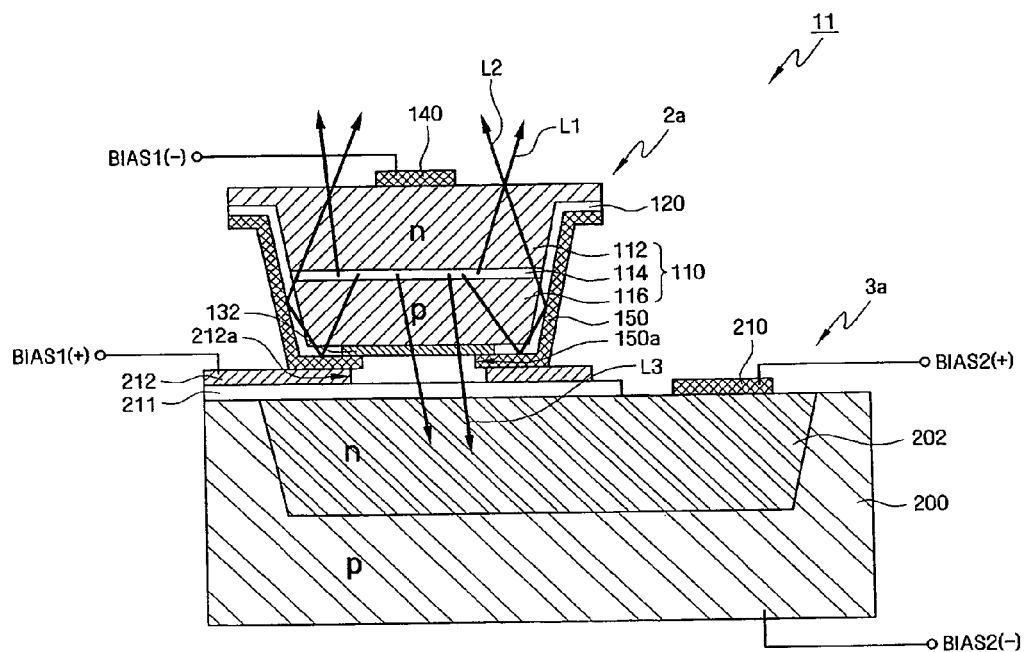
FIG. 5A is a cross-sectional view for explaining an operation of the light emitting device according to the second embodiment of the present invention.

FIG. 2 is a cross-sectional view of a light emitting device according to a second embodiment of the present invention, illustrating an exemplary embodiment of the circuit diagram shown in FIG. 1. FIGS. 3A and 3B illustrate shapes of a first electrode of the light emitting device according to the second embodiment of the present invention, FIG. 4 is a view illustrating a medium interconnection of the light emitting device according to the second embodiment of the present invention, and FIG. 5A is a view illustrating an operation of the light emitting device according to the second embodiment of the present invention.

First, referring to FIG. 2, the light emitting device 11 according to a second embodiment of the present invention includes a light emitting element 2a and a light converting element 3a which are stacked.

The light emitting element 2a may be of a vertical type. The light emitting element 2a includes a first electrode 150 configured in a bowl-like shape, a light emitting structure 110 formed in the first electrode 150 to generate light, and a second electrode 140 formed on the light emitting structure 110.

The light converting element 3a may be, for example, a photodiode. The light converting element 3a may include a substrate 200 of a first conductivity type and an impurity region 202 of a second conductivity type formed in the substrate 200. Here, the second conductivity type is different from the first conductivity type. In the light converting element 3a, there may be formed a third electrode 210 electrically connected to the impurity region 202.

Figure 8:
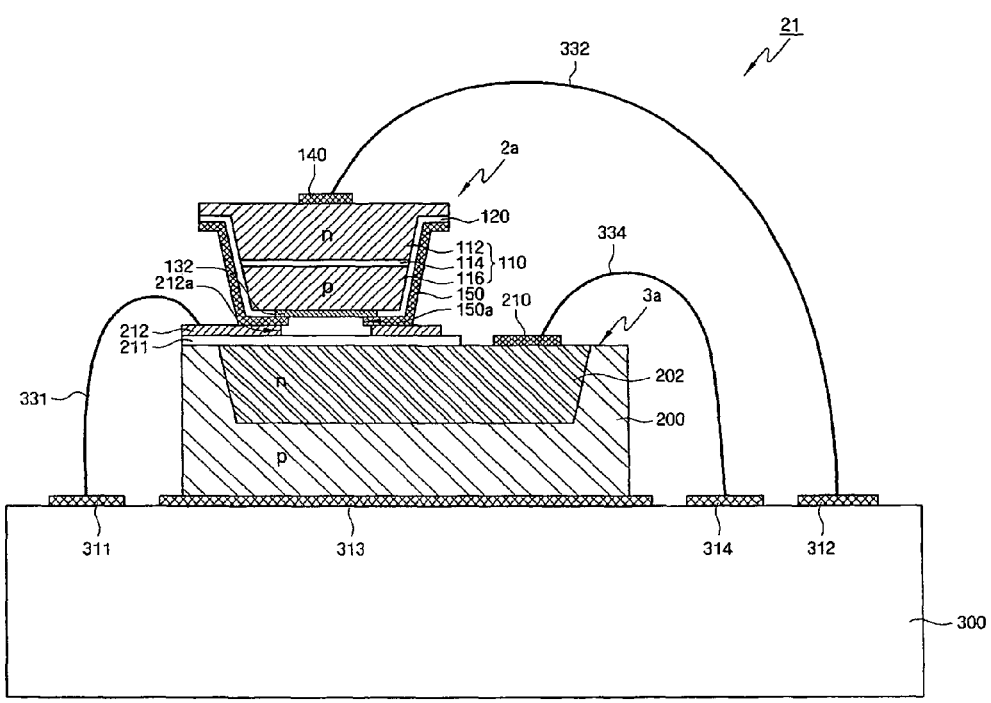
FIG. 8 is a cross-sectional view of a light emitting device according to a fifth embodiment of the present invention.
Figure 9:
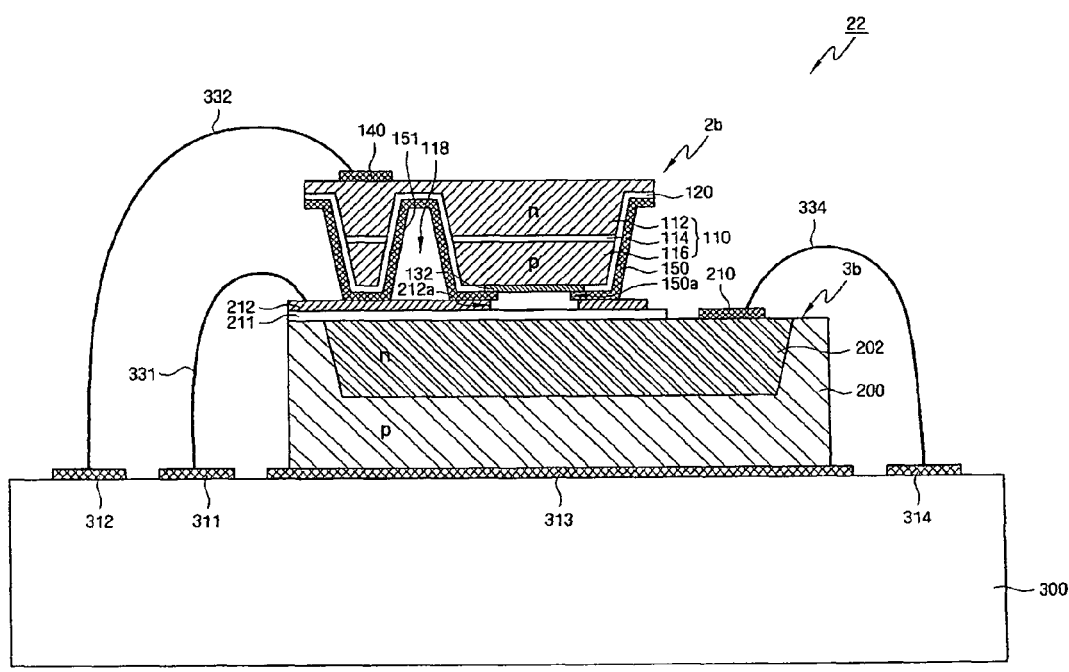
FIG. 9 is a cross-sectional view of a light emitting device according to a sixth embodiment of the present invention.

On the light emitting element 3a, a medium interconnection 212 may be formed to facilitate electrical connection, e.g., wire bonding, between the first electrode 150 of the light emitting element 2a and an interconnection of a circuit board (refer to 300 of FIGS. 8 and 9). A wire bonding method will later be described with reference to FIGS. 8 and 9. Thus, the medium interconnection 212 is electrically connected to the first electrode 150 but disconnected from the light emitting element 3a. An insulating film 211 formed between the light converting element 3a and the medium interconnection 212 may insulate the light converting element 3a from the medium interconnection 212.

In particular, in the light emitting device 11 according to the second embodiment of the present invention, the first electrode 150 includes a first opening 150a and the medium interconnection 212 includes a second opening 212a, so that light generated from the light emitting structure 110 can reach the light converting element 3a through the first opening 150a and the second opening 212a. With this configuration, the light converting element 3a is capable of detecting the light generated by the light emitting element 2a.

The first opening 150a may be formed, for example, in a central portion of a bottom of the first electrode 150 as shown in FIG. 3A. Alternately, the first opening 150a may be formed to divide the first electrode 150 into two parts, i.e., a left part and a right part, as shown in FIG. 3B. The second opening 212a may be formed, for example, in a central portion of the medium interconnection 212, as shown in FIG. 4. However, the various shapes of the first opening 150a and the second opening 212a shown in FIGS. 3A, 3B, and 4 are provided for illustration only, and the shapes of the first opening 150a and the second opening 212a may be modified as needed.

Returning to FIG. 2, the light emitting structure 110 of the light emitting element 2a may include a second conductive pattern 116 of the first conductivity type, a first light emitting pattern 114, and a first conductive pattern 112 of the first conductivity type, which are sequentially stacked. The first conductive pattern 112, the light emitting pattern 114, and the second conductive pattern 116 may include $In_xAl_yGa_{(1-x-y)}N$ ($0 \leq x \leq 1$, $0 \leq y \leq 1$), i.e., various materials including GaN. That is to say, the first conductive pattern 112, the light emitting pattern 114, and the second conductive pattern 116 may be, for example, AlGaN or InGaN.

The first conductive pattern 112 may be of the second conductivity type, e.g., an n type, and the second conductive pattern 116 may be of the first conductivity type, e.g., a p type; alternatively, the first conductive pattern 112 may be of the first conductivity type (p type) and the second conductive pattern 116 may be of the second conductivity type (n type).

The first light emitting pattern 114 is a region in which light is generated by a combination of a carrier, e.g., an electron, of the first conductive pattern 112 and a carrier, e.g., a hole, of the second conductive pattern 116. Although not illustrated in FIG. 2, the first light emitting pattern 114 may include a well layer and a barrier layer. Since the well layer has a smaller band gap than the barrier layer, carriers, e.g., electrons or holes, are collected and combined in the well layer. The first light emitting pattern 114 constructed as described above may be classified as a single quantum well (SQW) structure or a multiple quantum well (MQW) structure. The first light emitting pattern 114 having an SQW structure includes a single well layer, whereas the first light emitting pattern 114 having an MQW structure includes a plurality of well layers. To adjust light output characteristics, at least one element selected from the group consisting of B, P, Si, Mg, Zn, Se, and Al may be doped into at least one of the well layer and barrier layer of the first light emitting pattern 114.

The first electrode 150 has a larger upper width than its lower width so that sidewalls thereof may be inclined. The first electrode 150 may use a highly refractive material. The first electrode 150 may use at least one of silver (Ag) and aluminum (Al). As will be described later, the light generated from the light emitting structure 110 is reflected from the first electrode 150 and then emitted toward a front surface of the light emitting element 2a.

Since the insulating layer 120 is formed between the first electrode 150 and the light emitting structure 110, the first electrode 150 insulates the first conductive pattern 112 from the second conductive pattern 116. Thus, even if the first electrode 150 is formed at sides of the light emitting structure 110, i.e., the first electrode 150 surrounds the light emitting structure 110, leakage current is not generated between the first conductive pattern 112 and the second conductive pattern 116. The insulating layer 120 may include, for example, at least one of an oxide layer, a nitride layer, and an oxynitride layer.

The insulating layer 120 partially exposes the second conductive pattern 116, and an ohmic layer 132 is formed on the exposed second conductive pattern 116. As shown in FIG. 2, the ohmic layer 132 is formed to overlap the first electrode 150, so that the first electrode 150 and the second conductive pattern 116 are electrically connected through the ohmic layer 132. The ohmic layer 132 may use a material having high transmissivity, such as indium tin oxide (ITO). Since the light generated from the light emitting structure 110 reaches the light converting element 3a after passing through the ohmic layer 132, the first opening 150a, and the second opening 212a, the amount of light that reaches the light converting element 3a may increase as the transmissivity of the ohmic layer 132 increases.

The second electrode 140, formed on the first conductive pattern 112, is electrically connected to the first conductive pattern 112. In addition, the second electrode 140 may include at least one selected from the group consisting of indium tin oxide (ITO), copper (Cu), nickel (Ni), chromium (Cr), gold (Au), titanium (Ti), platinum (Pt), aluminum (Al), vanadium (V), tungsten (W), molybdenum (Mo), and silver (Ag).

The light converting element 3a may include the substrate 200 of the first conductive type and the impurity region 202 of the second conductivity type. As shown in FIG. 2, when the substrate 200 is of p type, the impurity region 202 may be of n type. Also, if the substrate 200 is of n type, the impurity region 202 may be of p type.

The substrate 200 may be a substrate made of silicon (Si), strained Si, SOI (Silicon-On-Insulator), silicon carbide (SiC), silicon germanium (SiGe), silicon germanium carbide (SiGeC), germanium, germanium alloy, gallium arsenide (GaAs), indium arsenide (InAs), III-V semiconductor and II-VI, a combination thereof, or a stack thereof.

An operation of the light emitting device 11 according to the second embodiment of the present invention will be described with reference to FIG. 5A.

As shown in FIG. 5A, when the second conductive pattern 116 is of p type and the first conductive pattern 112 is of n type, the first bias BIAS1(+) is applied to the second conductive pattern 116 through the first electrode 150 and the ohmic layer 132 and the second bias BIAS1(−) is applied to the first conductive pattern 112 through the second electrode 140. That is to say, the first bias BIAS1(+) is applied to the second conductive pattern 116 and the second bias BIAS1(−) is applied to the first conductive pattern 112, such that forward bias is applied to the light emitting structure 110. Light beams L1, L2, and L3 are emitted from the first light emitting pattern 114 through the forward bias.

More specifically, the light beam L1 is directly output through a front surface of the light emitting element 2a without being reflected from the first electrode 150, and the light beam L2 is output through the front surface of the light emitting element 2a after being reflected from the first electrode 150. That is to say, as the amount of light energy in the reflected light beam L2 increases, the bowl-shaped first electrode 150, which surrounds the light emitting structure 110, may increase the light output efficiency of the light emitting element 2a.

The light beam L3 reaches the light converting element 3a through the ohmic layer 132, the first opening 150a, and the second opening 212a.

The light converting element 3a, upon receiving the light beam L3, generates an electron/hole pair and stores the generated electron/hole. For example, the light converting element 3a stores an electron for the impurity region 202 of n type, and stores a hole for the impurity region 202 of p type.

The third bias BIAS2 (+) is applied to the third electrode 210 of the light converting element 3a, and the fourth bias BIAS2(−) is applied to the substrate 200. In the bias conditions, an external processor (not shown) can measure the amount of electrons/holes stored in the light converting element 3a.

Figure 5B:
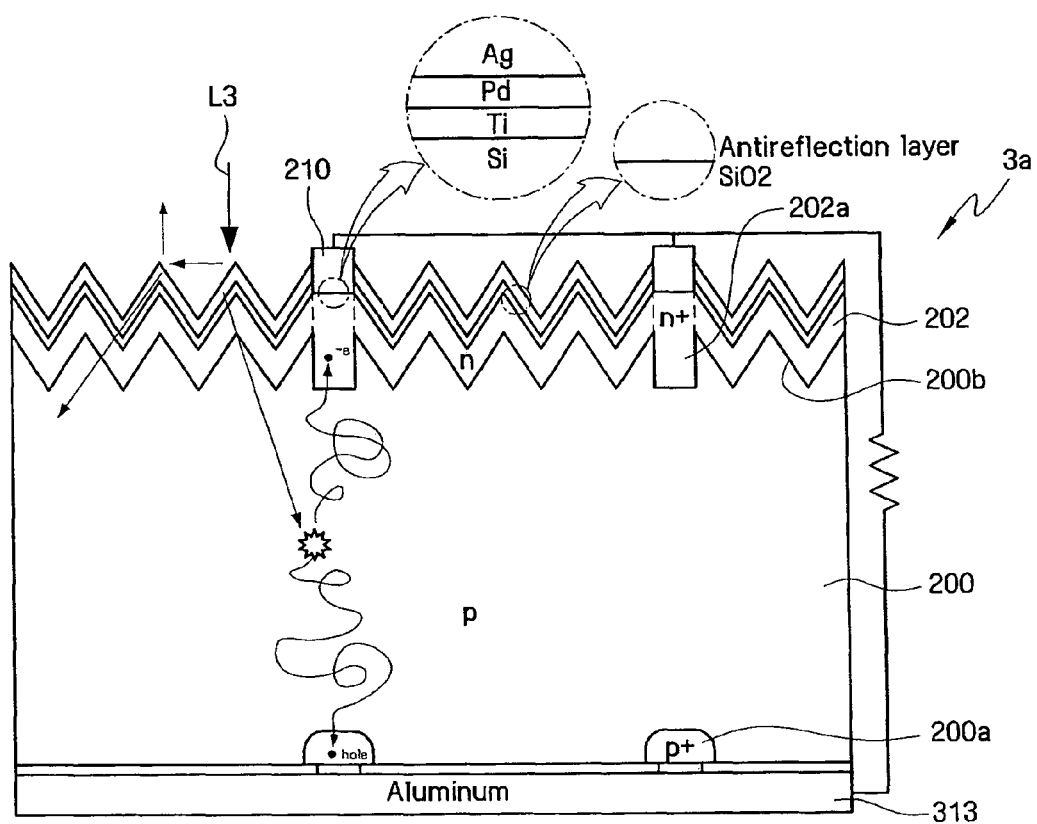
FIG. 5B is a cross-sectional view illustrating a modified example of the light emitting device shown in FIG. 5A.

FIG. 5B illustrates a modified example of the light emitting device shown in FIG. 5A. The light emitting device shown in FIG. 5B is an exemplary device for embodying a light converting element in the light emitting device shown in FIG. 2.

Referring to FIG. 5B, the light emitting device according to a modified embodiment of the present invention includes the light emitting element 2a formed on a first surface of the substrate 200 and a texture 200b formed on the first surface of the substrate 200 to improve the incident efficiency of the light beam L3 from the light emitting element 2a. The impurity region 202 may be formed along the texture 200b. The impurity region 202 may be formed by epitaxy or implantation. An insulating layer (e.g., $SiO_2$) and an antireflection layer may be formed conformal to the impurity region 202.

An impurity region 202a of the second conductivity type (e.g., n+) may be further formed on the first surface of the substrate 200. The concentration of the impurity region 202a may be higher than that of the impurity region 202. The impurity region 202a may be electrically connected to the third electrode 210. The third electrode 210 shown in FIG. 5B has a structure in which Ti, Pd, and Ag are sequentially stacked, but the present invention is not limited thereto.

An impurity region 200a of the first conductivity type (e.g., p+) may be formed on a second surface of the substrate 200. The concentration of the impurity region 200a may be higher than that of the substrate 200.

Once the light beam L3 is incident from the light emitting element 2a, a portion of the light beam L3 may be reflected without being incident into the light converting element 3a. However, the amount of light reflected from the surface may be reduced by providing the texture 200b formed on the substrate 200.

When the light beam L3 is incident into the substrate 200, an electron-hole pair (EHP) is formed in which holes gather in the impurity region 200a and electrons gather in the impurity region 202a due to the presence of the potential. Such gathering holes and electrons may be transferred through the interconnection.

An aluminum interconnection 313 shown in FIG. 5B will be later described in detail with reference to FIG. 8.

Figure 6:
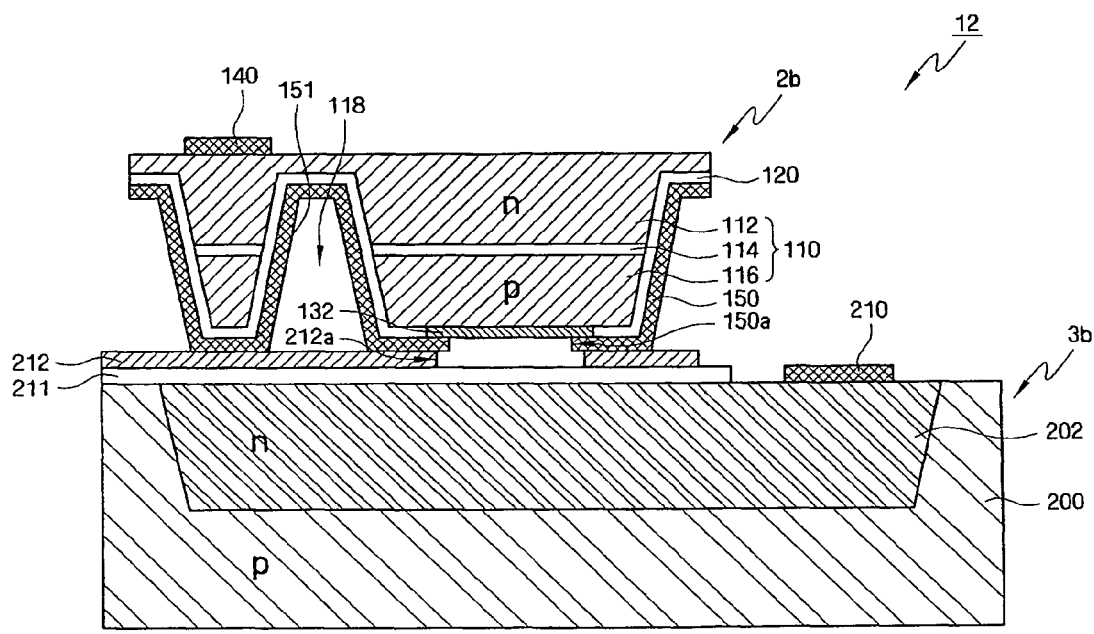
FIG. 6 is a cross-sectional view of a light emitting device according to a third embodiment of the present invention.

FIG. 6 is a cross-sectional view of a light emitting device according to a third embodiment of the present invention. The light emitting device shown in FIG. 6 is an exemplary circuit for embodying the light emitting device shown in FIG. 1.

Referring to FIG. 6, the light emitting device 12 according to a third embodiment of the present invention is different from the light emitting device 11 according to the second embodiment of the present invention in that a protrusion 151 is formed on the first electrode 150 generally in a bowl shape and as a result of the protrusion 151, a light emitting structure 110 formed in the first electrode 150 has a groove 118 formed therein.

With respect to the protrusion 151 or the groove 118, the light emitting structure 110 can be divided into a first side (e.g., a left side in the figure) and a second side (e.g., a right side in the figure). The second electrode 140 may be formed on the first side of the light emitting structure 110.

In such a configuration, light generated from the second side of the light emitting structure 110 is reflected from the protrusion 151 of the first electrode 150 and then is emitted through a front surface of a light emitting element 2b. Since the second electrode 140 is positioned at the first side of the light emitting structure 110, it does not interfere with a path of light.

Figure 7:
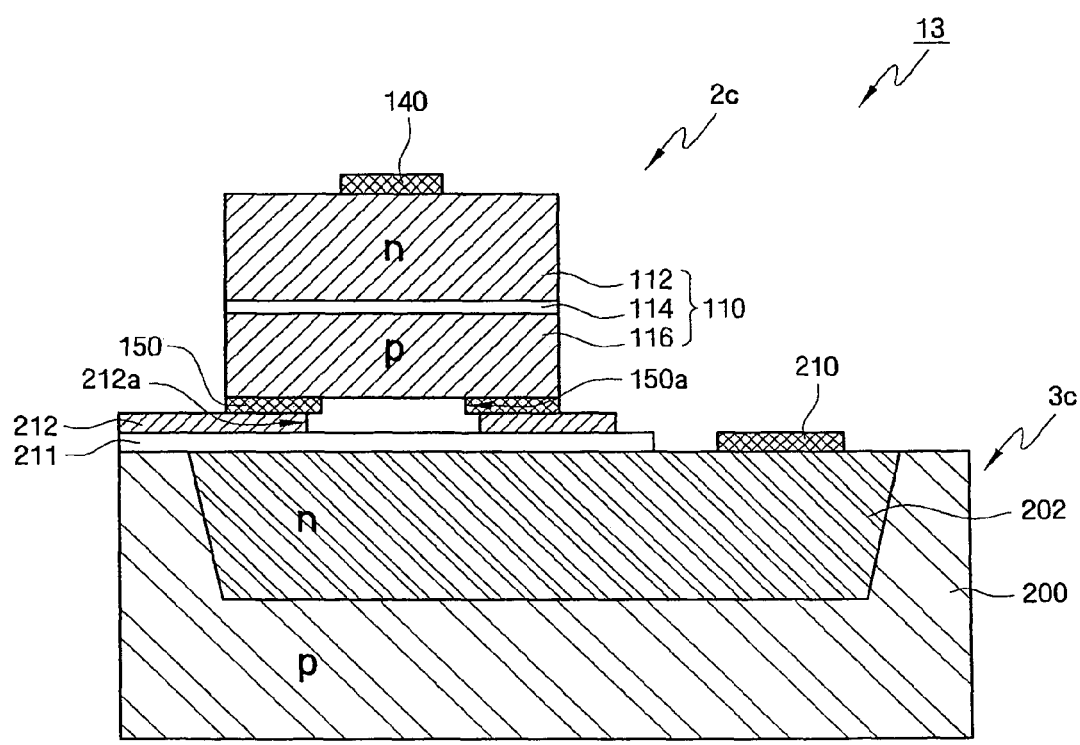
FIG. 7 is a cross-sectional view of a light emitting device according to a fourth embodiment of the present invention.

FIG. 7 is a cross-sectional view of a light emitting device according to a fourth embodiment of the present invention. The light emitting device shown in FIG. 7 is an exemplary circuit for embodying the light emitting device shown in FIG. 1.

Referring to FIG. 7, a light emitting device 13 according to a fourth embodiment of the present invention is different from the light emitting device 11 according to the second embodiment of the present invention in that the first electrode 150 is not provided in a bowl shape that surrounds the light emitting structure 110. Instead, the first electrode 150 may be formed only on a bottom surface of the light emitting structure 110.

FIG. 8 is a cross-sectional view of a light emitting device according to a fifth embodiment of the present invention. In detail, FIG. 8 shows a mechanism by which the light emitting device 11 shown in FIG. 2 can be connected to a circuit board 300.

Referring to FIG. 8, a light emitting device 21 according to a fifth embodiment of the present invention includes the circuit board 300 and the light emitting device 11 disposed on the circuit board 300.

The circuit board 300 includes a first interconnection 311, a second interconnection 312, a third interconnection 313, and a fourth interconnection 314, which are electrically separated from each other.

The first interconnection 311 is electrically connected to the first electrode 150 of the light emitting element 2a. More specifically, the first interconnection 311 and the medium interconnection 212 are connected by a wire 331, and the medium interconnection 212 and the first electrode 150 are directly connected to each other. The second interconnection 312 are electrically connected to the second electrode 140 of the light emitting element 2a. More specifically, the second interconnection 312 and the second electrode 140 are connected by a wire 332. The third interconnection 313 is electrically connected to the substrate 200. More specifically, the substrate 200 may be disposed on and, in contact with, the third interconnection 313. The fourth interconnection 314 is electrically connected to the impurity region 202. More specifically, the fourth interconnection 314 and the third electrode 210 are connected by a wire 334, and the third electrode 210 and the impurity region 202 are directly connected to each other.

FIG. 9 is a cross-sectional view of a light emitting device according to a sixth embodiment of the present invention. In detail, FIG. 9 shows a mechanism by which the light emitting device 11 shown in FIG. 2 is connected to the circuit board 300.

Referring to FIG. 9, a light emitting device 22 according to a sixth embodiment of the present invention includes the circuit board 300 and the light emitting device 11 disposed on the circuit board 300. The circuit board 300 includes the first interconnection 311, the second interconnection 312, the third interconnection 313, and the fourth interconnection 314, which are electrically separated from each other. The first through fourth interconnections 311 through 314 shown in FIG. 9 are connected to the first electrode 150, the second electrode 140, the substrate 200, and the third electrode 210 in substantially the same manner as described in FIG. 8 except for their positions.

Figure 10:
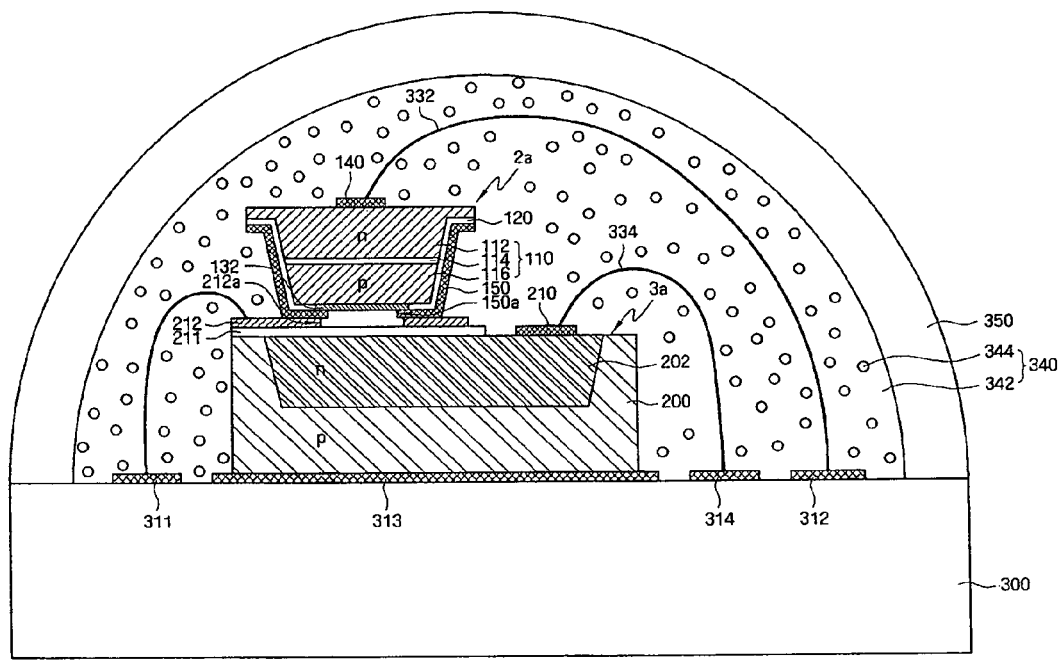
FIG. 10 is a cross-sectional view of a light emitting device according to a seventh embodiment of the present invention.

FIG. 10 is a cross-sectional view of a light emitting device according to a seventh embodiment of the present invention.

Referring to FIG. 10, the light emitting device according to a seventh embodiment of the present invention is different from the light emitting device 21 according to the fifth embodiment of the present invention (see FIG. 8) in that it includes a fluorescent layer 340 surrounding the light emitting device 11 and a second transparent resin 350 surrounding the fluorescent layer 340.

The fluorescent layer 340 may be a blend of a first transparent resin 342 and a phosphor 344. The phosphor 344 dispersed in the fluorescent layer 340 absorbs light emitted from the light emitting device 11 and performs a wavelength conversion that alters the wavelength of the light to a different wavelength, so light emitting characteristics can be improved through a better distribution profile of the phosphor 344. In such a manner, the wavelength conversion performed by the phosphor 344 and color mixing effects can be enhanced.

For example, in order to produce white light, the light emitting device 11 may be provided with the fluorescent layer 340. When the light emitting device 11 outputs light of a blue wavelength, the phosphor 344 may include a yellow phosphor and a red phosphor to improve color rendering index (CRI). When the light emitting device 11 outputs an ultraviolet (UV) light wavelength, the phosphor 344 may include three primary color phosphors, that is, red, green and blue (RGB) phosphors.

Any suitable material can be used as the first transparent resin 342 as long as the phosphor 344 may be stably dispersed therein. Examples of the useful material may include epoxy resin, silicon resin, hardening silicon resin, denatured silicon resin, urethane resin, oxetane resin, acryl resin, polycarbonate resin, polyimide resin, and so on.

The phosphor 344 may be any material which, for example, absorbs the light emitted from the light emitting structure 110, and performs a wavelength conversion that alters the wavelength of the light to a different wavelength.

For example, one or more materials selected from amongst nitride-based phosphors or oxynitride-based phosphors activated mainly with lanthanoid elements such as Eu or Ce, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors and germanate phosphors activated mainly with lanthanoid elements such as Eu or transition metal elements such as Mn, rare earth aluminate phosphors and rare earth silicate phosphors activated mainly with lanthanoid elements such as Ce, and organic or organic complex phosphors activated mainly with lanthanoid elements such as Eu are preferred. Specifically, the phosphors listed below can be used, although the following is not a restrictive list.

Examples of nitride-based phosphors activated mainly with lanthanoid elements such as Eu or Ce include $M_2Si_5N_8$:Eu (wherein, M is at least one element selected from Sr, Ca, Ba, Mg and Zn). Furthermore, other examples in addition to $M_2Si_5N_8$:Eu include $MSi_7N_{10}$:Eu, $M_{1.8}Si_5O_0.2N_8$:Eu, and $M_{0.9}Si_7O_0.1N_{10}$:Eu (wherein, M is at least one element selected from Sr, Ca, Ba, Mg and Zn).

Examples of oxynitride-based phosphors activated mainly with lanthanoid elements such as Eu or Ce include $MSi_2O_2N_2$:EU (wherein, M is at least one element selected from Sr, Ca, Ba, Mg and Zn).

Examples of alkaline earth halogen apatite phosphors activated mainly with lanthanoid elements such as Eu or transition metal elements such as Mn include $M_5(PO_4)_3X$:R (wherein, M represents at least one element selected from Sr, Ca, Ba, Mg and Zn, X represents at least one element selected from F, Cl, Br and I, and R represents at least one of Eu, Mn, and a combination of Eu and Mn).

Examples of alkaline earth metal halogen borate phosphors include $M_2B_5O_9X{:}R$ (wherein, M represents at least one element selected from Sr, Ca, Ba, Mg and Zn, X represents at least one element selected from F, Cl, Br and I, and R represents at least one of Eu, Mn, and a combination of Eu and Mn).

Examples of alkaline earth metal aluminate phosphors include $SrAl_2O_4{:}R$, $Sr_4Al_14O_25{:}R$, $CaAl_2O_4{:}R$, $BaMg_2Al_16O_27{:}R$, $BaMg_2Al_16O_12{:}R$, and $BaMgAl_10O_17{:}R$ (wherein, R represents at least one of Eu, Mn, and a combination of Eu and Mn).

Examples of alkaline earth sulfide phosphors include $La_2O_2S{:}Eu$, $Y_2O_2S{:}Eu$, and $Gd_2O_2S{:}Eu$.

Examples of rare earth aluminate phosphors activated mainly with lanthanoid elements such as Ce include YAG phosphors represented by compositional formulas such as $Y_3Al_5O_{12}{:}Ce$, $(Y_0.8Gd_0.2)_3Al_5O_{12}{:}Ce$, $Y_3(Al_0.8Ga_0.2)_5O_{12}{:}Ce$, and $(Y,Gd)_3(Al,Ga)_5O_{12}$. Furthermore, other examples include phosphors such as $Tb_3Al_5O_{12}{:}Ce$ and $Lu_3Al_5O_{12}{:}Ce$ in which a portion of, or all of, the Y has been replaced with Tb or Lu or the like.

Examples of other phosphors include $ZnS{:}Eu$, $Zn_2GeO_4{:}Mn$ and $MGa_2S_4{:}Eu$ (wherein, M represents at least one element selected from Sr, Ca, Ba, Mg and Zn).

The above phosphors may also comprise one or more elements selected from Tb, Cu, Ag, Au, Cr, Nd, Dy, Co, Ni and Ti, either instead of Eu or in addition to Eu.

Furthermore, other phosphors that offer similar performance and effects to the phosphors listed above can also be employed.

The second transparent resin 350 is in a lens shape and diffuses light emitted from the light emitting device 11. By adjusting the curvature and flatness of the second transparent resin 350, diffusion/extraction characteristics can be controlled. The second transparent resin 350 is formed surrounding the fluorescent layer 340, so that it can protect the fluorescent layer 340. This is because the property of the phosphor 344 may be degraded in the event of contact with moisture.

Any material can be used as the second transparent resin 350 as long as it exhibits a light transmittance. Examples of the useful material may include epoxy resin, silicon resin, hardening silicon resin, denatured silicon resin, urethane resin, oxetane resin, acryl, polycarbonate, polyimide, and the like.

Figure 11:
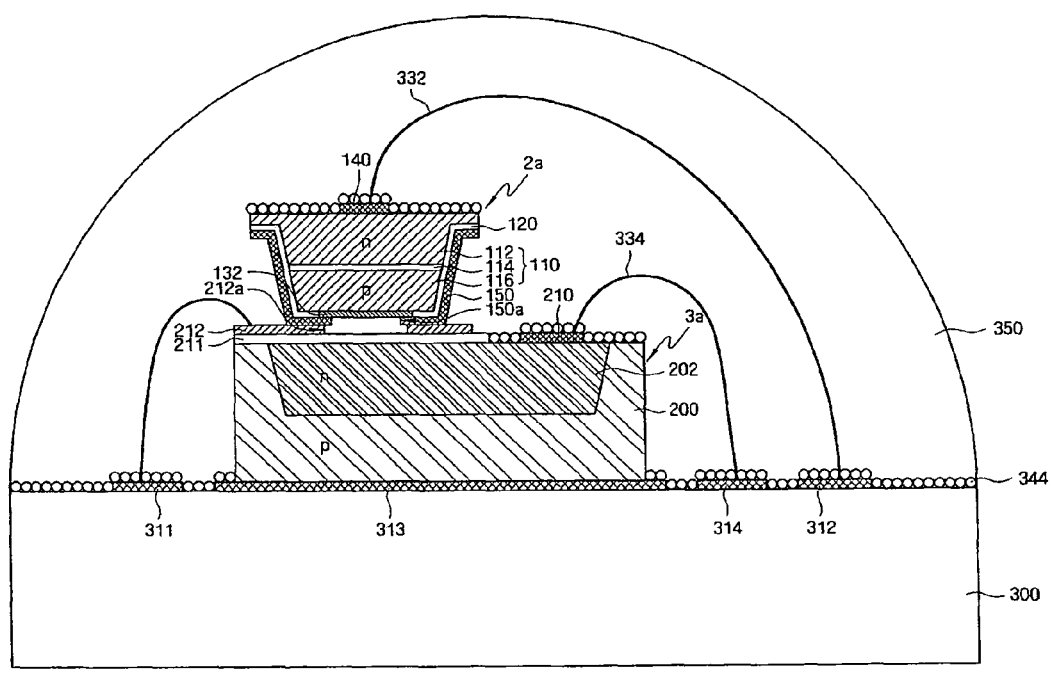
FIG. 11 is a cross-sectional view of a light emitting device according to an eighth embodiment of the present invention.

FIG. 11 is a cross-sectional view of a light emitting device according to an eighth embodiment of the present invention.

Referring to FIG. 11, the phosphor 344 is formed along the profile, or upper surface, of the light emitting device 11 and the circuit board 300.

In this case, the phosphor 344 may be applied without a separate first transparent resin (342 of FIG. 10).

If the phosphor 344 is applied without a separate first transparent resin, the transparent resin surrounding the light emitting device 11 is a single layer, that is, a single layer 350 without the first transparent resin 342.

Figure 12:
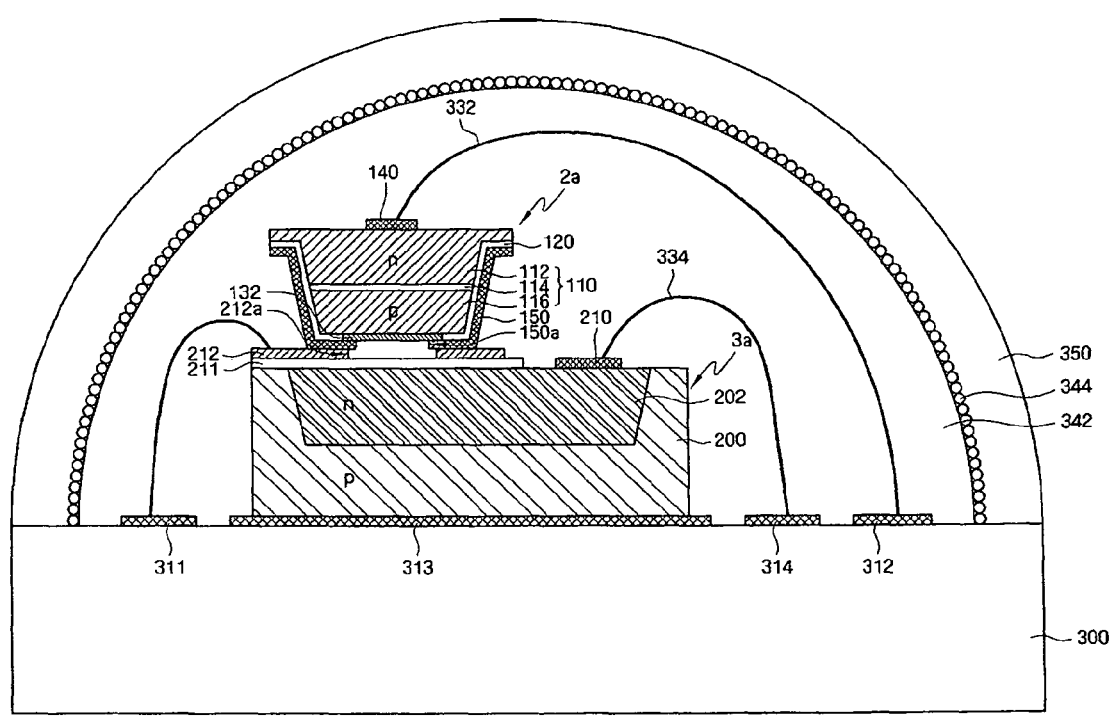
FIG. 12 is a cross-sectional view of a light emitting device according to a ninth embodiment of the present invention.

FIG. 12 is a cross-sectional view of a light emitting device according to a ninth embodiment of the present invention.

Referring to FIG. 12, the light emitting device according to a ninth embodiment of the present invention is different from that according to the seventh embodiment of the present invention in that it includes the first transparent resin 342 surrounding the light emitting device 11, the phosphor 344 formed on the first transparent resin 342, and the second transparent resin 350 formed on the phosphor 344.

That is to say, since the first transparent resin 342 and the phosphor 344 are separately applied to the first transparent resin 342, rather than being applied in a mixed form, the phosphor 344 can be formed in a thin layer that conforms to the surface of the first transparent resin 342.

Figure 13:
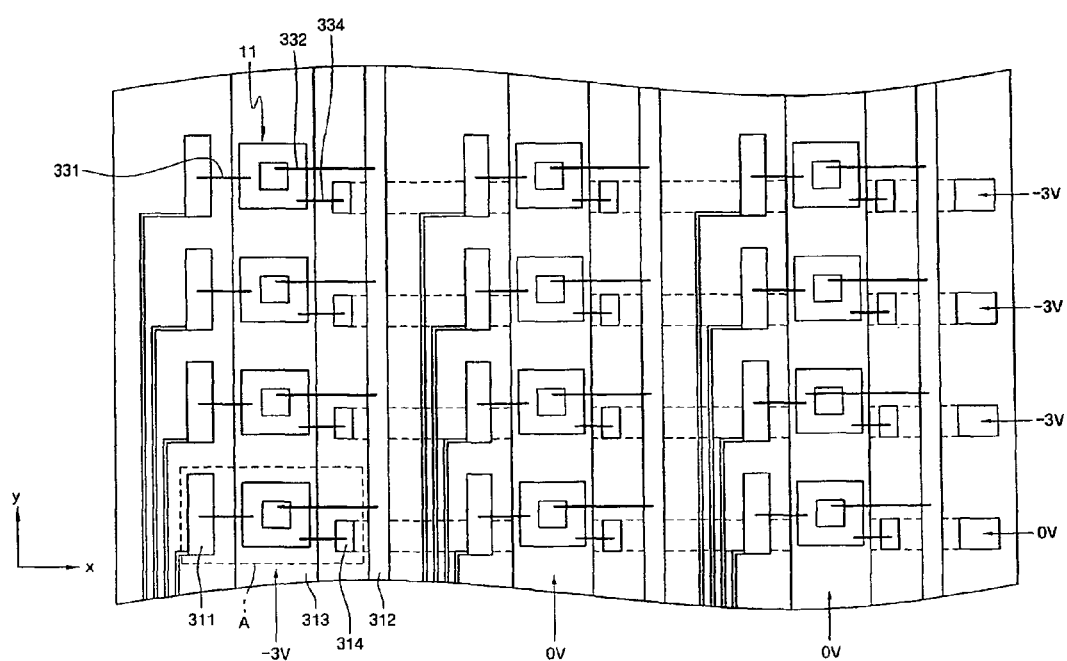
FIGS. 13, 14A and 14B are plane views and perspective views respectively of light emitting devices according to a tenth embodiment of the present invention.
Figure 14A:
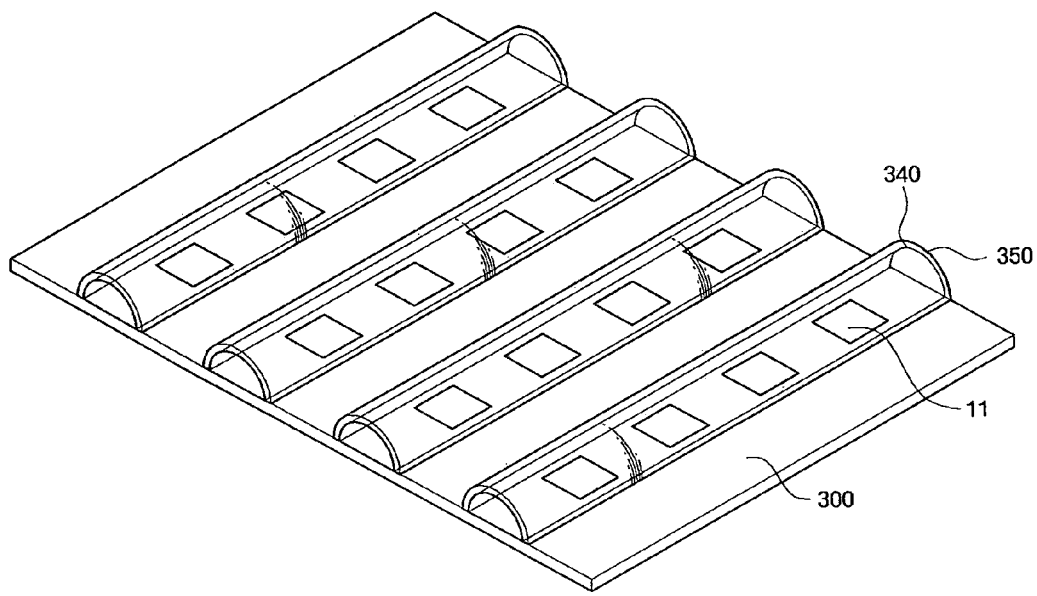
Figure 14B:
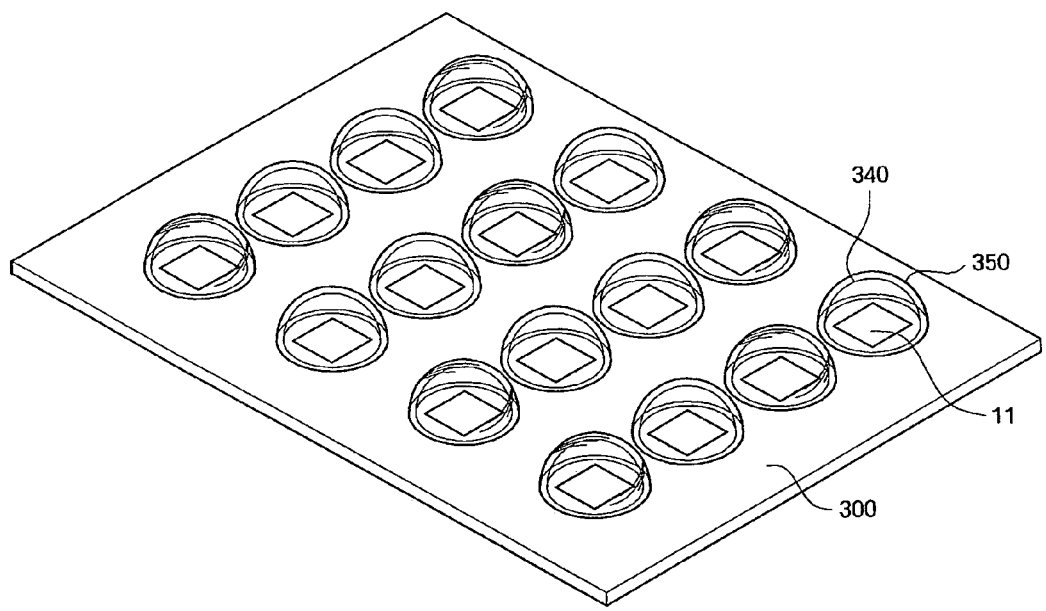

FIGS. 13, 14A and 14B are views of a light emitting device according to a tenth embodiment of the present invention. Specifically, FIGS. 13, 14A and 14B illustrate a light emitting device array in which a plurality of light emitting devices are arranged on a circuit board. More specifically, FIGS. 14A and 14B illustrate exemplary patterns in which the fluorescent layer 340 and the second transparent resin 350 are formed on the light emitting device array.

Referring first to FIG. 13, the first through fourth interconnections 311 through 314 are arranged on the circuit board 300. The first and second interconnections 311 and 312 are associated with driving of light emitting elements 2a, and the third and fourth interconnections 313 and 314 are associated with driving of light converting elements 3a.

Although not shown, a processor may be disposed to be shared by light emitting devices 11 arranged along the y-axis. In FIG. 13, there may be a total of three processors including a processor for five left light emitting devices 11, a processor for five middle light emitting devices 11, and a processor for five right light emitting devices 11.

Each first interconnection 311 may be disposed to correspond to each light emitting device 11 and each second interconnection 312 may be disposed to be shared by light emitting devices 11 arranged along the y-axis. First and second biases may be applied to the first and second interconnections 311 and 312, and for example, the first bias may be a positive bias and the second bias may be ground. Although not accurately shown in the drawing, each first interconnection 311 may be directly connected to a processor. That is to say, the light emitting device 11 positioned in the left bottommost in FIG. 13 may be directly connected to a corresponding processor and the light emitting device 11 positioned in the left topmost in FIG. 13 may be directly connected to a corresponding processor. With such connections, light emitting elements 2a can be independently driven.

Each third interconnection 313 is disposed to be shared by the light emitting devices 11 arranged along the y-axis. On the other hand, each fourth interconnection 314 is disposed to be shared by the light emitting devices 11 arranged along the x-axis. That is to say, as indicated by dotted lines, the fourth interconnections 314 arranged along the x-axis are connected to each other through interconnections (not shown, see the dotted lines) installed in the board 300. With such connections, light converting elements 3a can be independently driven, which will now be described.

As shown in FIG. 13, −3V is applied to the third interconnection 313 arranged in the leftmost and 0V is applied to the other two third interconnections 313. 0V is applied to the fourth interconnection 314 disposed in the bottommost and −3V is applied to the other fourth interconnections 314.

Under these bias conditions, the light emitted from the light emitting elements 2a can be measured by operating only the light converting element 3a positioned in the bottom leftmost.

Referring to FIG. 14A, the fluorescent layers 340 and the second transparent resins 350 may be formed as line-type arrays. For example, if the light emitting devices 11 are arranged in a direction in which the third interconnection 313 extends, as shown in FIG. 13, the fluorescent layer 340 and the second transparent resin 350 may also be arranged in the direction in which the third interconnection 313 extends.

Referring to FIG. 14B, the fluorescent layers 340 and the second transparent resins 350 may be formed as a dot type.

Each fluorescent layer 340 and each second transparent resin 350 may be formed to surround only corresponding light emitting devices 11.

Figure 15:
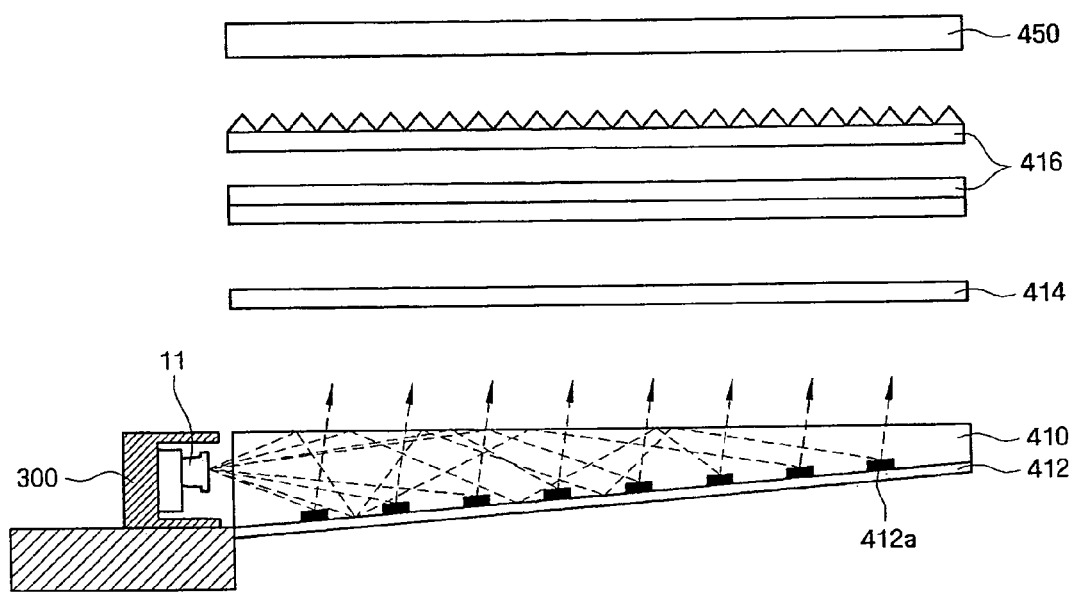
FIG. 15 is a view of a light emitting device according to an eleventh embodiment of the present invention.

FIG. 15 is a view of a light emitting device according to an eleventh embodiment of the present invention.

The light emitting device shown in FIG. 15 is an end product embodying the eleventh embodiment of the present invention. Light emitting devices according to embodiments of the present invention are applicable to various devices, such as illumination devices, display devices, mobile devices such as cellular phones, MP3 players, or navigation keypads, and so forth. An exemplary device shown in FIG. 15 is an edge type back light unit (BLU) used in a liquid crystal display (LCD). Since the LCD cannot emit light by itself, the BLU is used as a light source which usually illuminates from the back of a liquid crystal panel.

Referring to FIG. 15, the BLU includes the light emitting device 11, a light guide plate 410, a reflection sheet 412, a diffusion sheet 414, and a pair of prism sheets 416.

The light emitting device 11 supplies a liquid crystal panel 450 with light. The light emitting device 11 used herein may be of a side-view type.

The light guide plate 410 guides the light supplied to the liquid crystal panel 450. The light guide plate 410 is formed of a transparent plastic material such as acryl, so it guides the light generated from the light emitting device 11 toward the liquid crystal panel 450 disposed on the light guide plate 410. To this end, various patterns 412a for changing the traveling direction of the light incident into the light guide plate 410 towards the liquid crystal panel 450 are printed on a bottom surface of the light guide plate 410.

The reflection sheet 412 is disposed on a bottom surface of the light guide plate 410 and reflects light upward from below the light guide plate 410. By doing so, the loss of light can be reduced and at the same time, the uniformity of light transmitting through the light emitting surface of the light guide plate 410 can be improved.

The diffusion sheet 414 disperses the light emitted from the light guide plate 410, thereby preventing the light from being partially concentrated.

Trigonal prisms are formed in a predetermined arrangement on a top surface of the prism sheet 416. Typically, 2 prism sheets are provided so that prism arrangements can be crossed with respect to each other at a predetermined angle, thereby allowing the light diffused from the diffusion sheet 414 to travel in a direction perpendicular to the liquid crystal panel 450.

FIGS. 16 to 19 are views of light emitting devices according to twelfth to fifteenth embodiments of the present invention.

Figure 16:
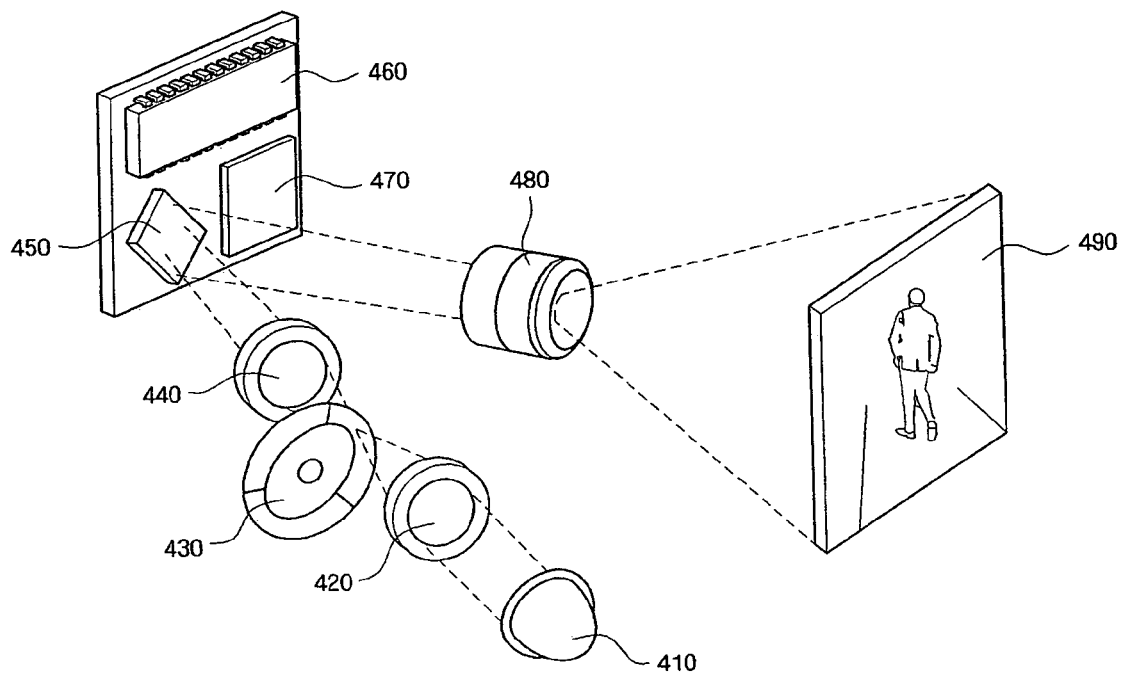
FIGS. 16 to 19 are views of light emitting devices according to twelfth to fifteenth embodiments of the present invention, respectively.
Figure 17:
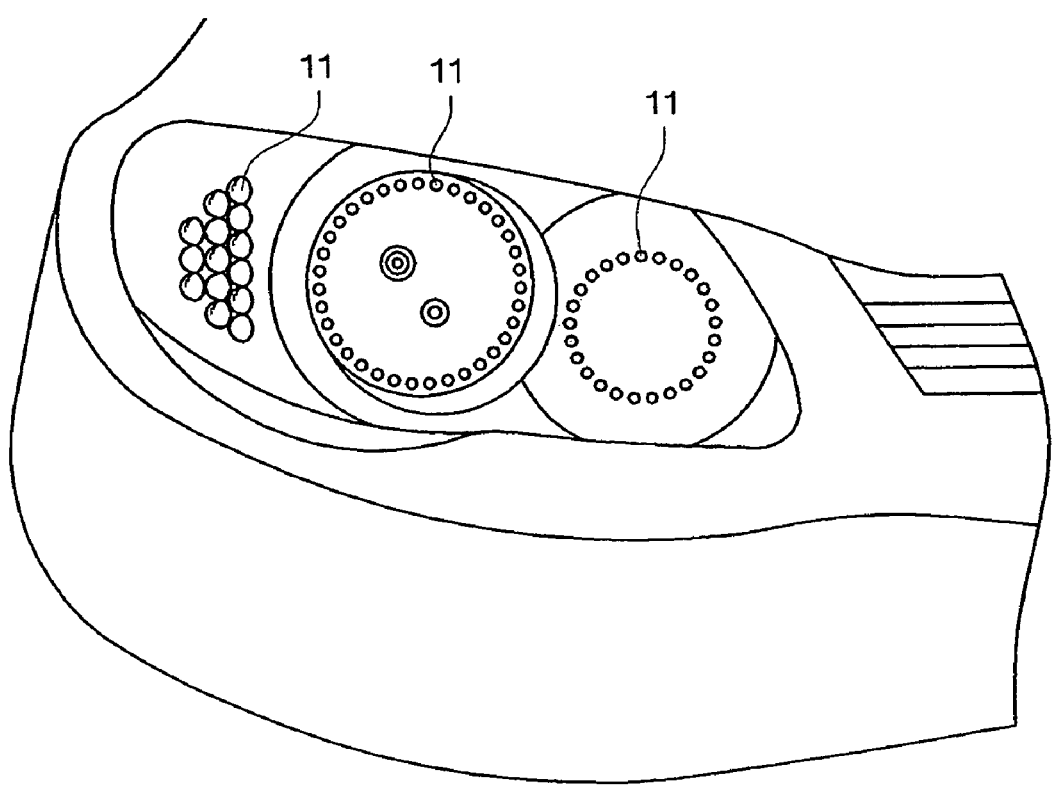
Figure 18:
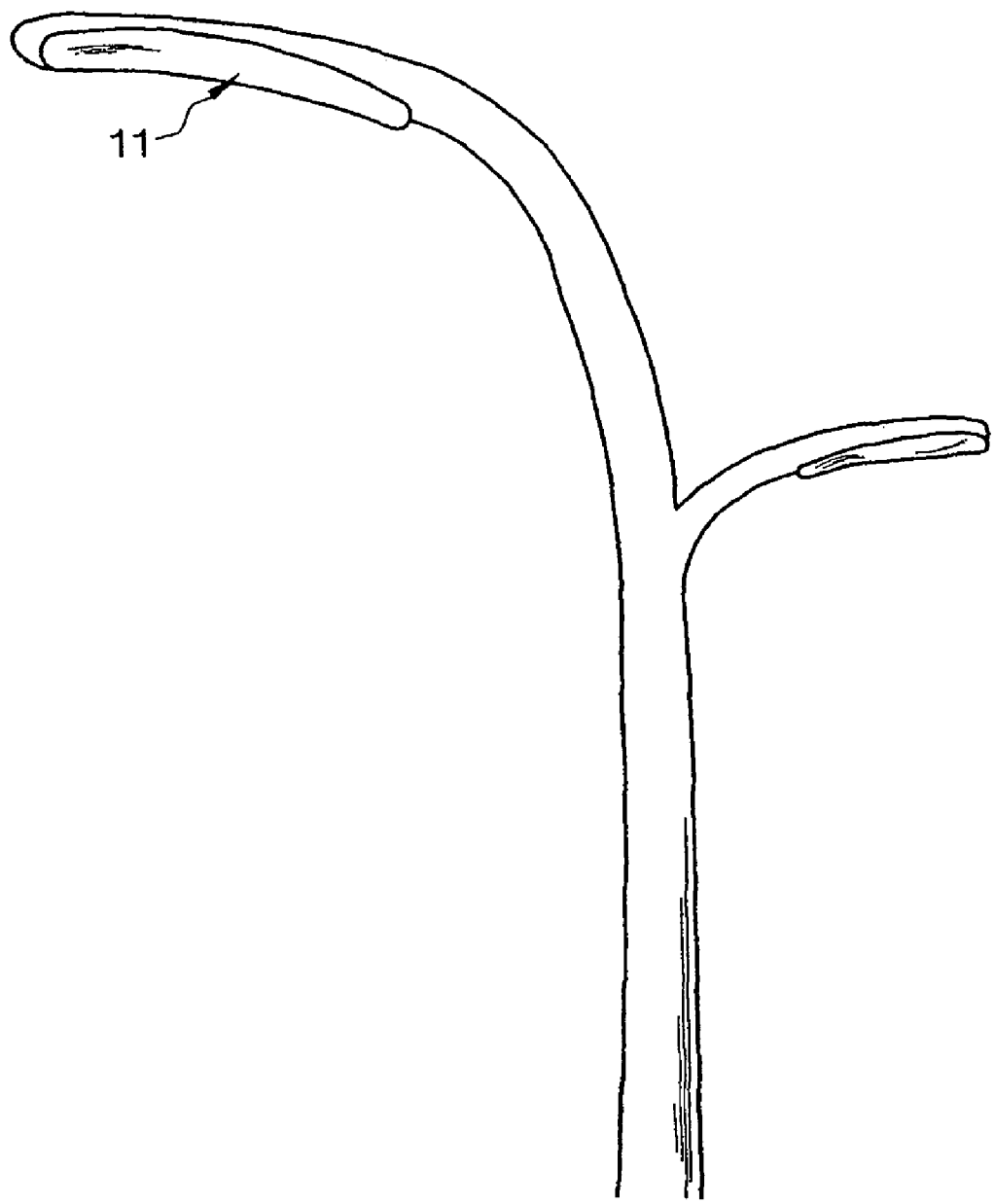
Figure 19:
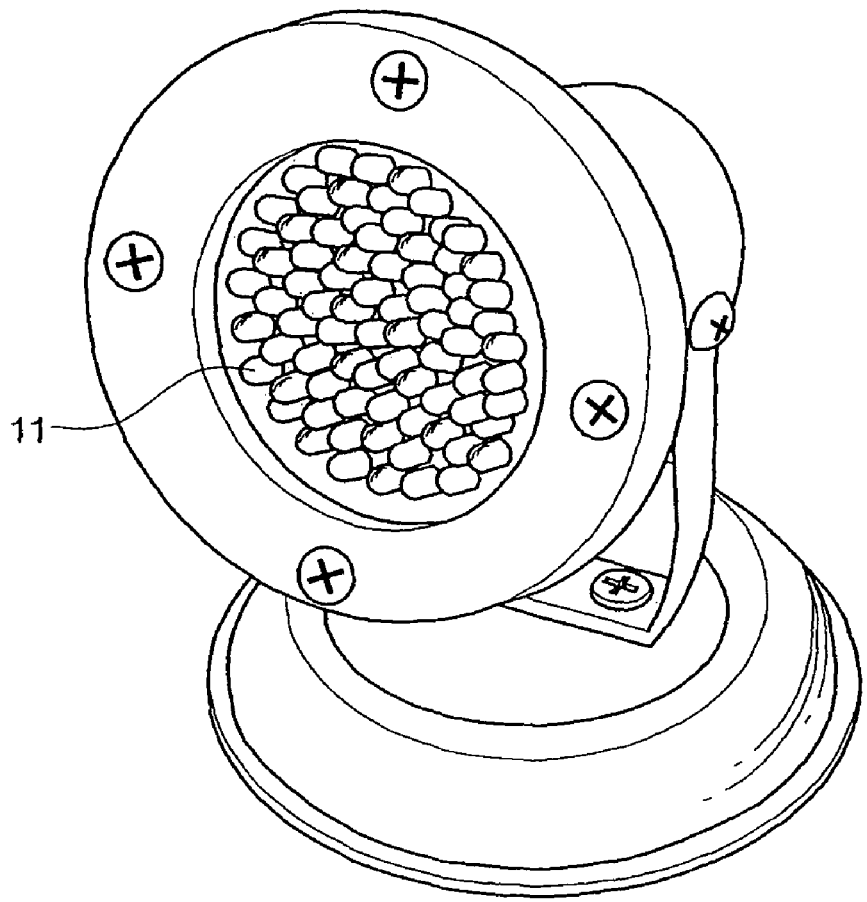

The light emitting devices shown in FIGS. 16 to 19 are exemplary end products embodying the twelfth to fifteenth embodiments of the present invention. In detail, FIG. 16 shows a projector, FIG. 17 shows a head light of a car, and FIG. 19 shows a street lamp, respectively.

Referring to FIG. 16, light coming from a light source 410 passes through a condensing lens 420, a color filter 430, and a sharping lens 440, then is reflected from a digital micromirror device (DMD) 450, then passes through a projection lens 480, and then arrives a screen 490. A light emitting device according to the present invention is mounted in the light source 410.

Hereinafter, a fabricating method of the light emitting device according to the second embodiment of the present invention will be described with reference to FIGS. 20 to 26. FIGS. 20 to 26 are views of intermediate processing steps in a fabricating method of the light emitting device according to the second embodiment of the present invention.

Figure 20:
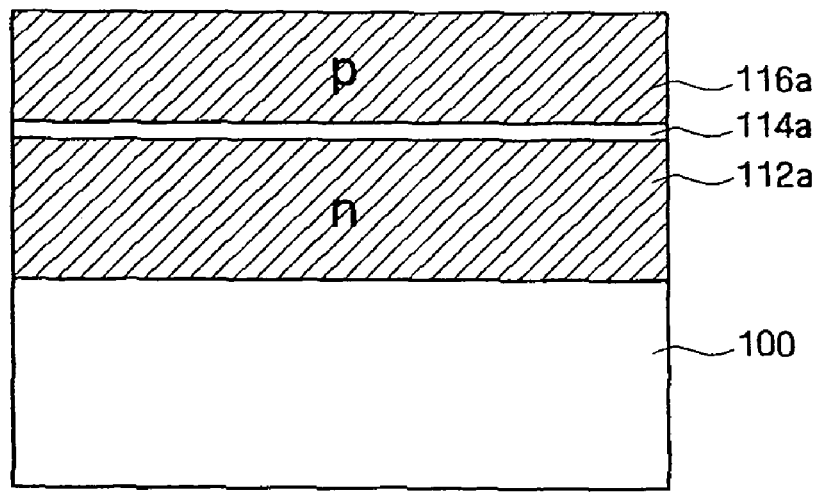
FIGS. 20 to 26 are views of intermediate processing steps in a fabricating method of the light emitting device according to the second embodiment of the present invention.

First, referring to FIG. 20, a first conductive layer 112a of a first conductivity type, a light emitting layer 114a, and a second conductive layer 116a of a second conductivity type are formed on a substrate 100.

The first conductive layer 112a, the light emitting layer 114a, and the second conductive layer 116a may be grown by metal organic chemical vapor deposition (MOCVD), liquid phase epitaxy, hydride vapor phase epitaxy, molecular beam epitaxy, metal organic vapor phase epitaxy, and other suitable techniques.

Figure 21:
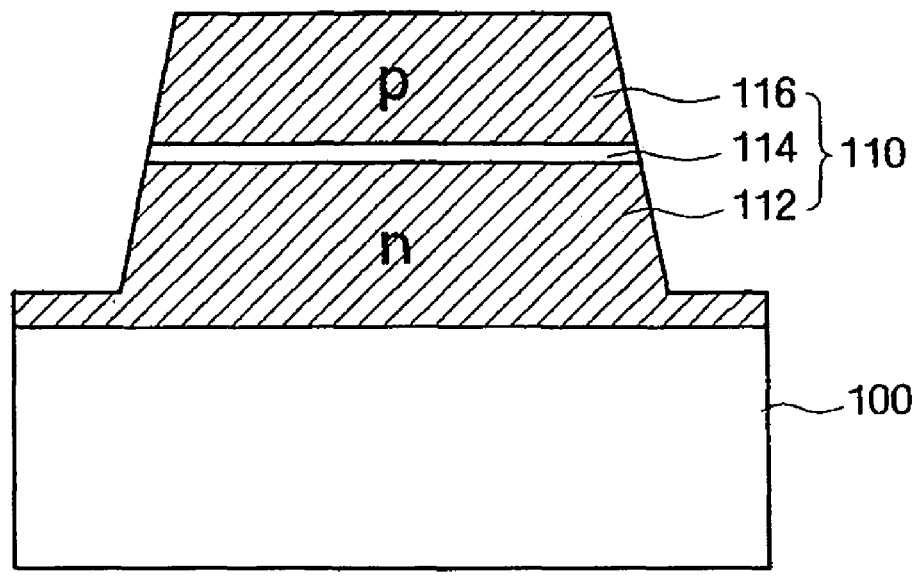

Referring to FIG. 21, the second conductive layer 116a, the light emitting layer 114a and the first conductive layer 112a are patterned to complete the light emitting structure 110 including the second conductive pattern 116, the light emitting pattern 114, and the first conductive pattern 112. When the second conductive layer 116a, the light emitting layer 114a and the first conductive layer 112a are patterned, the sidewalls of the light emitting structure 110 may be formed to be inclined.

Figure 22:
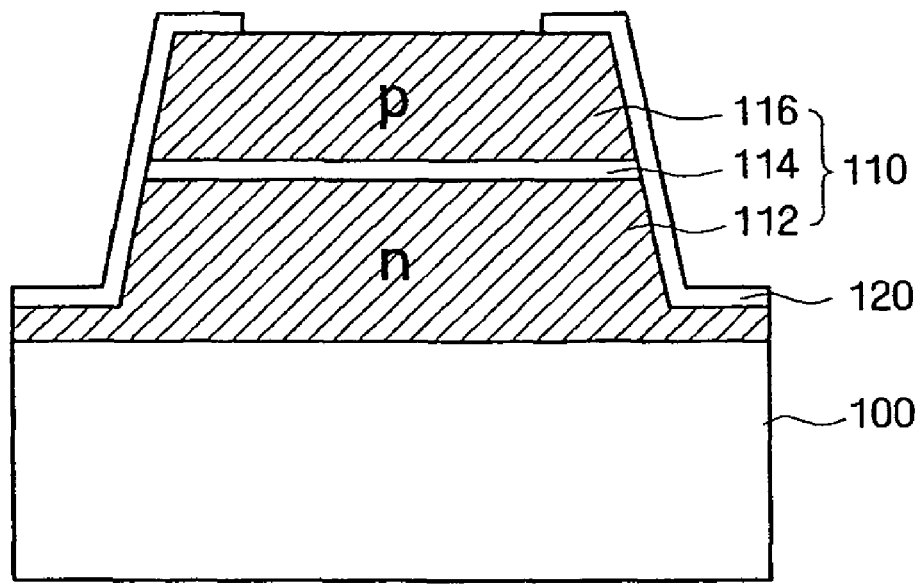

Referring to FIG. 22, the insulating layer 120 is formed on the light emitting structure 110 including the second conductive pattern 116, the light emitting pattern 114, and the first conductive pattern 112. Next, the first conductive pattern 112 is partially exposed by patterning the insulating layer 120.

Figure 23:
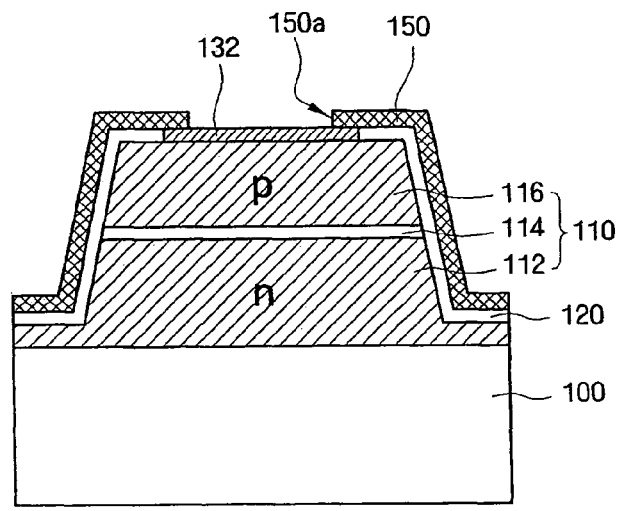

Referring to FIG. 23, the ohmic layer 132 is formed on the first conductive pattern 112 exposed by the insulating layer 120.

Next, a conductive layer is formed conformal to the insulating layer 120 and the ohmic layer 132 and then is patterned, thereby forming the first electrode 150 which partially overlaps with the ohmic layer 132. The first electrode 150 includes the first opening 150a.

Figure 24:
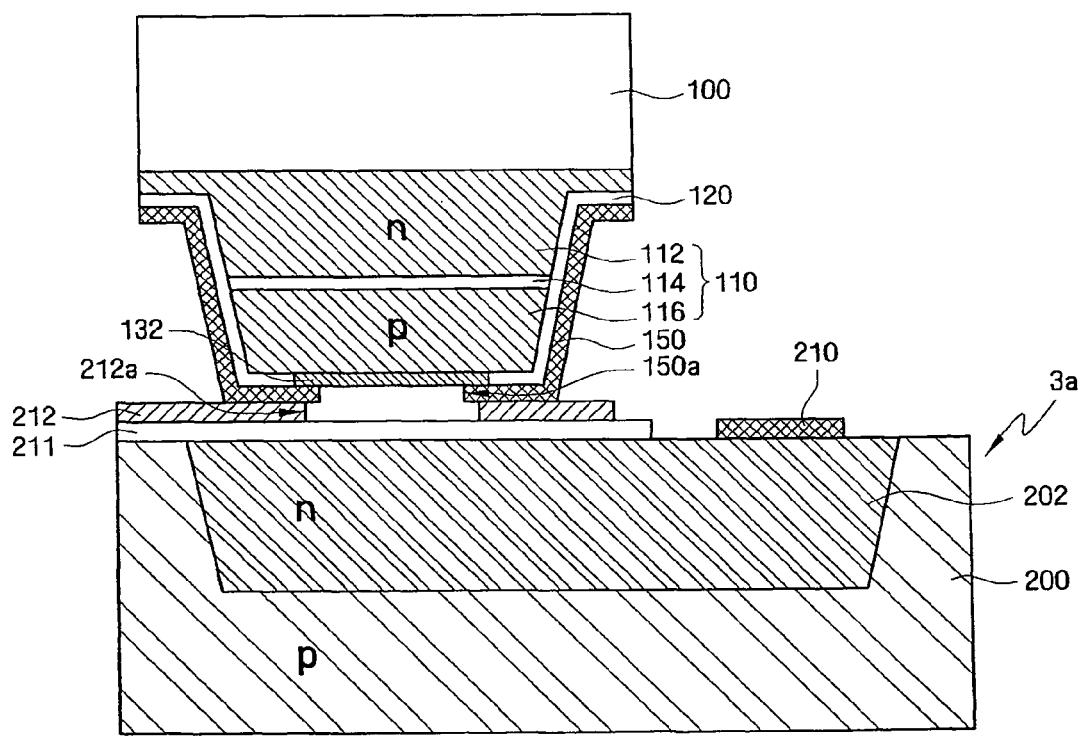

Referring to FIG. 24, the substrate 100 and the light converting element 3a are bonded. Here, the bonding is carried out in a state in which the first electrode 150 faces the light converting element 3a.

More specifically, the light converting element 3a includes the substrate 200 of the first conductivity type and the impurity region 202 of the second conductivity type formed in the substrate 200, where the first conductivity type is different from the second conductivity type.

Here, the substrate 200 is larger in size than the substrate 100. In other words, when the substrate 200 and the substrate 100 are superposed, the substrate 100 is not seen because it is covered by the larger substrate 200. For example, in a case where the substrate 200 and the substrate 100 are formed in a round shape, the diameter of the substrate 200 may be larger than that of the substrate 100. More specifically, the diameter of the substrate 200 may greater than 6 inches (about 150 mm) and the diameter of the substrate 100 may be smaller than 6 inches. Alternatively, in a case where the substrate 200 and the substrate 100 are formed in a square shape, the diagonal length of the substrate 200 may be larger than that of the substrate 100.

The substrate 100 may be a conductive substrate, and examples of useful materials thereof may include at least one selected from the group consisting of silicon (Si), strained Si, SOI (Silicon-On-Insulator), silicon carbide (SiC), silicon germanium (SiGe), silicon germanium carbide (SiGeC), germanium, germanium alloy, gallium arsenide (GaAs), indium arsenide (InAs), III-V semiconductor and II-VI, a combination thereof, or a stack thereof.

The substrate 100 or the substrate 200 is a preferably substantially flat. In a case where the substrate 100 or the substrate 200 is bent, bonding can be difficult to carry out. Since an intermediate material layer (not shown) is disposed between the substrate 100 and the substrate 200, a slight substrate warpage can be compensated for by the intermediate material layer, particularly if the intermediate material layer has a sufficient thickness, which will later be described.

For example, the bonding may be performed on the substrate 200 or a plurality of substrates 100 by adhesive bonding, which will be described below in detail.

First, the substrate 200 and the plurality of substrates 100 are washed clean. It is preferable that the surfaces of the substrate 200 and the substrates 100 to be bonded be kept clean.

This is because various foreign matter (e.g., particles, dusts, etc.) sticking on the surfaces of the substrate 200 and the substrates 100 may become contamination sources. That is to say, when the substrate 200 and the substrates 100 are bonded together, bonding energy may be weakened due to the presence of foreign matter between the substrate 200 and the substrates 100. If the bonding energy is weak, the substrate 200 and the substrates 100 are likely to become separated from each other.

Next, the intermediate material layer is formed on the to-be-bonded surface of the substrate 200 or on the to-be-bonded surfaces of the plurality of substrates 100. The intermediate material layer may be a layer made of a conductive material, for example, a metal layer. For example, when the intermediate material layer is a metal layer, the metal layer may contain at least one metal selected from the group consisting of Au, Ag, Pt, Ni, Cu, Sn, Al, Pb, Cr and Ti. In other words, the metal layer may be a single layer formed of Au, Ag, Pt, Ni, Cu, Sn, Al, Pb, Cr or Ti, a stack thereof, or a combination thereof. For example, the metal layer may be an Au single layer, an Au—Sn double layer, or a multi-layer having Au and Sn alternately stacked several times. The intermediate material layer may be made of a material having lower reflectivity than that of the first electrode 150.

Figure 25:
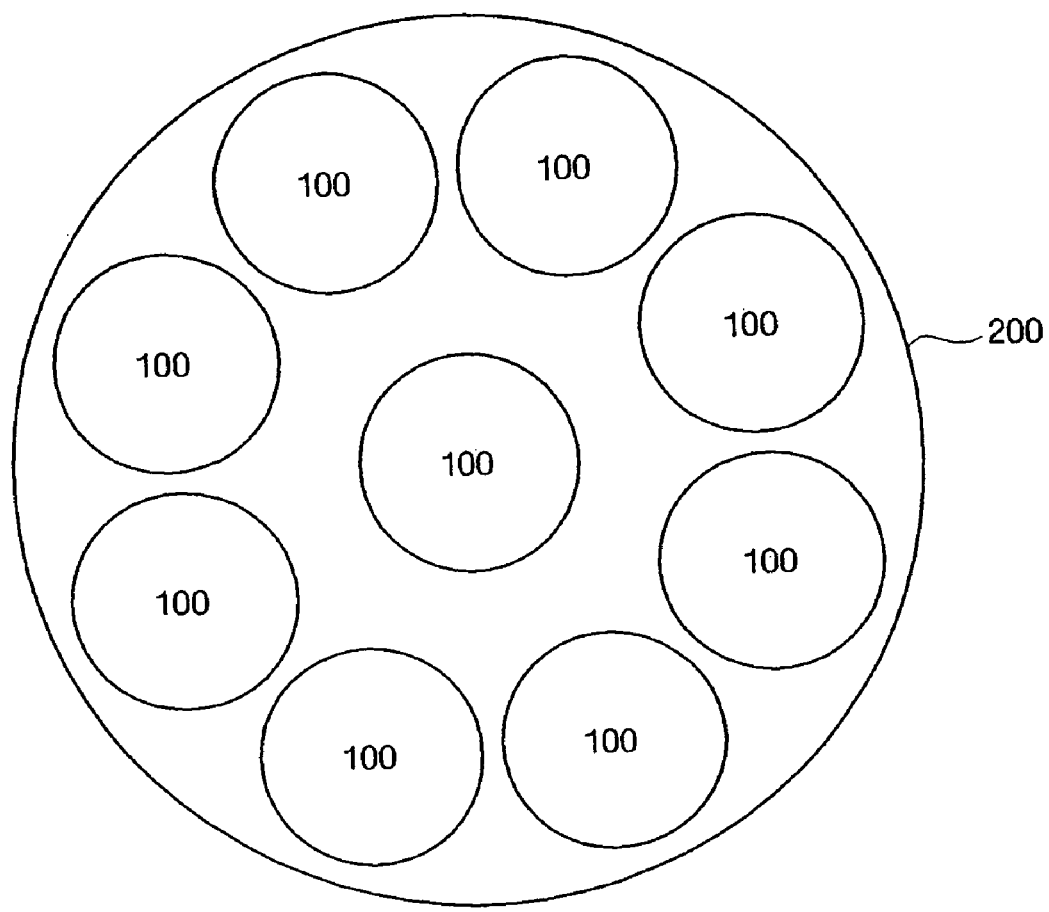

Thereafter, the first electrode 150 formed on each of the substrates 100 and the to-be-bonded surface of the substrate 200 are made to face each other. As shown in FIG. 25, if the diameter of the substrate 100 is 2 inches and the diameter of the substrate 200 is 8 inches, for example, nine substrates 100 may be arranged on the single substrate 200.

Next, the substrate 200 and the plurality of substrates 100 are thermally treated for bonding. In a thermally treating process, the substrate 200 and the plurality of substrates 100 may be compressed, followed by bonding.

Figure 26:
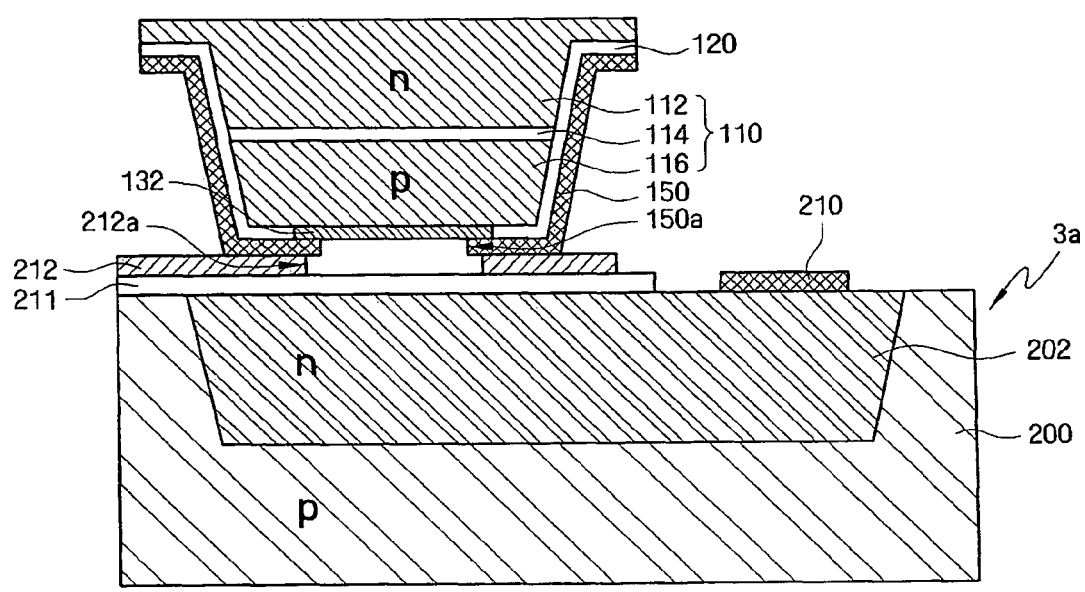

Referring to FIG. 26, the plurality of substrates 100 are removed.

The removing of the plurality of substrates 100 may be performed by a laser lift off (LLO) process. More specifically, a laser is irradiated from the substrate 100. Here, the laser having a relatively smaller surface area scans the substrates 100 having a relatively large surface area, and the substrate 100 begins to be exfoliated sequentially from a portion into which the laser is irradiated.

To prevent the light emitting device from being damaged during the LLO process, the thickness of the substrate 100 may be reduced prior to LLO process. Since the substrates 100 is sequentially exfoliated from a portion to which the laser is irradiated as mentioned above, the light emitting structure 110 may be broken or damaged due to a physical force caused during the exfoliation of the substrate 100. The physical force applied during the exfoliation of the substrate 100 can be reduced by thinning the substrate 100 in advance through chemical mechanical polishing (CMP) or the like, thereby preventing the light emitting structure 110 from being damaged during the LLO process.

Referring back to FIG. 2, the second electrode 140 is thereby formed on the second conductive pattern 116 exposed by removing the substrates 100.

Although not shown, before or after formation of the second electrode 140, surface texturing may be carried out to shape textures on a surface of the first conductive pattern 112. The textures may be shaped by performing wet-etching on the surface of the first conductive pattern 112 using an etching solution, such as KOH.

Subsequently, the resulting product is diced into units of chips through a dicing or sawing process, thereby completing the light emitting device 11.

As described above, since fabricating processes are performed after the plurality of small substrates 100 are bonded to the large substrate 200, a fabrication facility adapted to larger substrates can be utilized without a need for additionally installing a fabrication facility adapted to smaller substrates. Moreover, since a plurality of small substrates 100 are processed simultaneously, the throughput is improved, thus lowering the unit cost of the light emitting device 11. However, the substrate 200 having a size similar to the substrate 100 may be used if the unit cost is not a significant issue.

Although not shown, a separate bonding process (that is, a bonding process performed independently of the bonding processes shown in FIGS. 24 and 25) may be used after the process shown in FIG. 20. More specifically, as shown in FIG. 20, the second conductive layer of the second conductivity type, the light emitting layer, and the first conductive layer of the first conductivity type are sequentially formed on the substrate, and the substrate where the second conductive layer, the light emitting layer, and the first conductive layer are formed is bonded to the large substrate, followed by patterning of the stacked first conductive layer, light emitting layer, and second conductive layer as shown in FIG. 21, thereby forming the light emitting structure including the first conductive pattern, the light emitting pattern, and the second conductive pattern.

A fabricating method of other light emitting devices can be analogized from the fabricating method of the light emitting device according to the second embodiment of the present invention by those of ordinary skill in the art, and thus a description thereof will not be provided. Since a person skilled in the art can sufficiently analogize the technical contents which are not described in the following concrete experimental examples, the description thereof is omitted.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A light emitting device comprising:
a light converting element including a substrate and an impurity region, wherein the impurity region is formed in a well-type structure within the substrate; and
a light emitting element formed on the substrate of the light converting element and positioned above the impurity region, the light emitting element including a first electrode, a light emitting structure and a second electrode,
wherein the first electrode includes a first opening,
wherein the light emitting structure includes a first conductive pattern of a first conductivity type, a light emitting pattern, and a second conductive pattern of a second conductivity type, which are sequentially stacked, wherein the second electrode is formed on the second conductive pattern, and wherein the first opening is formed below the light emitting structure and the light generated from the light emitting structure reaches the light converting element through the first opening.

2. The light emitting device of claim 1, wherein the substrate is of the first conductivity type and the impurity region is of the second conductivity type, the second conductivity type being different than the first conductivity type.

3. The light emitting device of claim 2, wherein the light emitting device is positioned on a circuit board, the circuit board includes first through fourth interconnections to which different biases are applied, respectively, the first and second interconnections are electrically connected to the first and second electrodes, respectively, and the third and fourth interconnections are electrically connected to the substrate of the first conductivity type and the impurity region of the second conductivity type, respectively.

4. The light emitting device of claim 3, wherein the biases applied to the first and second interconnections are adjusted based on a change in the light detected by the light converting element.

5. The light emitting device of claim 1, wherein the light converting element includes an insulating layer formed thereon, the insulating layer including a medium interconnection formed thereon, the medium interconnection including a second opening, and the first electrode is disposed on the medium interconnection, and wherein the light generated from the light emitting structure reaches the light converting element through the first and second openings.

6. The light emitting device of claim 1, wherein the first electrode is configured in a bowl shape of a bowl and wherein the light emitting structure is configured to fill the first electrode.

7. The light emitting device of claim 6, wherein the first electrode has an upper width greater than a lower width.

8. The light emitting device of claim 6, wherein an inner sidewall of the first electrode is configured in the bowl shape of a bowl, and wherein the inner sidewall is inclined.

9. The light emitting device of claim 1, wherein the light emitting element electrically connected between a first node and a second node, and the light converting element is electrically connected between a third node and a fourth node, wherein the light converting element is bonded to the light emitting element to sense light generated by the light emitting element, and wherein different biases are applied to the first through fourth nodes, respectively.

10. The light emitting device of claim 1, wherein the light converting element is a photodiode.

11. The light emitting device of claim 1, wherein the first conductivity type is a p type and the second conductivity type is an n type.

* * * * *